US012170273B2

(12) United States Patent
Gomes et al.

(10) Patent No.: US 12,170,273 B2
(45) Date of Patent: Dec. 17, 2024

(54) INTEGRATED CIRCUIT ASSEMBLIES WITH DIRECT CHIP ATTACH TO CIRCUIT BOARDS

(71) Applicant: Intel Corporation, Santa Clara, CA (US)

(72) Inventors: Wilfred Gomes, Portland, OR (US); Sanka Ganesan, Chandler, AZ (US); Abhishek A. Sharma, Hillsboro, OR (US); Doug B. Ingerly, Portland, OR (US); Mauro J. Kobrinsky, Portland, OR (US); Kevin Fischer, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 586 days.

(21) Appl. No.: 17/210,682

(22) Filed: Mar. 24, 2021

(65) Prior Publication Data

US 2022/0173046 A1 Jun. 2, 2022

Related U.S. Application Data

(60) Provisional application No. 63/119,928, filed on Dec. 1, 2020.

(51) Int. Cl.
*H01L 25/18* (2023.01)
*H01L 23/00* (2006.01)
(Continued)

(52) U.S. Cl.
CPC ............ *H01L 25/18* (2013.01); *H01L 23/12* (2013.01); *H01L 23/5286* (2013.01);
(Continued)

(58) Field of Classification Search
CPC ......... H01L 24/16; H01L 24/13; H01L 25/18; H01L 25/50; H10L 23/49827;
(Continued)

(56) References Cited

U.S. PATENT DOCUMENTS 11,018,264 B1    5/2021 Gomes et al.
2003/0230801 A1* 12/2003 Jiang ................ H01L 23/49805
                                                257/E25.023
(Continued)

FOREIGN PATENT DOCUMENTS

CN         110875206 A        3/2020
WO    WO-2019132958 A1 *    7/2019    ............. G02B 6/125
WO    WO-2019133019 A1 *    7/2019    ............. H01L 21/48

OTHER PUBLICATIONS

International Search Report and Written Opinion in International Patent Application No. PCT/US2021/051886 dated Feb. 7, 2022, 12 pages.
Tallis, Billy, "Micron 3D NAND Status Update," AnandTech, retrieved from the internet on Jun. 10, 2019, https://www.anandtech.com/show/10028/micron-3d-nand-status-update, 6 pages.
(Continued)

*Primary Examiner* — Jaehwan Oh
*Assistant Examiner* — John M Parker
(74) *Attorney, Agent, or Firm* — Akona IP PC

(57) ABSTRACT

Various aspects of the present disclosure set forth IC dies, microelectronic assemblies, as well as related devices and packages, related to direct chip attach of dies and circuit boards. An example microelectronic assembly includes a die with IC components provided over the die's frontside, and a metallization stack provided over the die's backside. The die further includes die interconnects extending between the frontside and the backside of the die, to electrically couple the IC components and the metallization stack. The assembly further includes backside conductive contacts, provided over the side of the metallization stack facing away from the die, the backside conductive contacts configured to route signals to/from the IC components via the metallization
(Continued)

stack and the die interconnects, and configured to be coupled to respective conductive contacts of a circuit board in absence of a package substrate between the die and the circuit board.

20 Claims, 10 Drawing Sheets

(51) Int. Cl.
  *H01L 23/12* (2006.01)
  *H01L 23/528* (2006.01)
  *H01L 23/538* (2006.01)
  *H01L 25/065* (2023.01)

(52) U.S. Cl.
  CPC ...... *H01L 23/5384* (2013.01); *H01L 23/5385* (2013.01); *H01L 23/5386* (2013.01); *H01L 24/08* (2013.01); *H01L 25/0652* (2013.01); *H01L 2224/08145* (2013.01); *H01L 2225/06513* (2013.01); *H01L 2225/06541* (2013.01); *H01L 2225/06582* (2013.01); *H01L 2225/06589* (2013.01); *H01L 2924/1431* (2013.01); *H01L 2924/1436* (2013.01); *H01L 2924/1437* (2013.01)

(58) Field of Classification Search
  CPC ............ H10L 23/5286; H10L 23/5384; H10L 23/5385; H10L 23/12; H10L 23/49816; H10L 23/3128
  See application file for complete search history.

(56) References Cited

U.S. PATENT DOCUMENTS

| | | |
|---|---|---|
| 2009/0321947 A1* | 12/2009 | Pratt ................. H01L 24/16 438/109 |
| 2011/0073998 A1 | 3/2011 | Lin |
| 2011/0248404 A1 | 10/2011 | Chiu et al. |
| 2012/0187564 A1 | 7/2012 | Tsuge et al. |
| 2013/0256884 A1 | 10/2013 | Meyer |
| 2014/0021605 A1* | 1/2014 | Yu ................. H01L 23/49827 257/E23.021 |
| 2014/0312491 A1 | 10/2014 | Jin et al. |
| 2015/0064899 A1 | 3/2015 | Ji et al. |
| 2015/0092378 A1 | 4/2015 | Roy et al. |
| 2019/0006296 A1 | 1/2019 | Morrow et al. |
| 2019/0098802 A1 | 3/2019 | Mokler et al. |
| 2019/0157227 A1 | 5/2019 | Fillion et al. |
| 2019/0221557 A1 | 7/2019 | Kim et al. |
| 2019/0267319 A1 | 8/2019 | Sharma et al. |
| 2019/0371766 A1* | 12/2019 | Liu ................. H01L 24/92 |
| 2020/0075569 A1 | 3/2020 | Jeng et al. |
| 2020/0135719 A1 | 4/2020 | Brewer |
| 2020/0273783 A1 | 8/2020 | Sankman et al. |
| 2020/0273840 A1 | 8/2020 | Elsherbini et al. |
| 2020/0411428 A1 | 12/2020 | Lilak et al. |
| 2021/0125990 A1 | 4/2021 | Gomes et al. |
| 2021/0134802 A1 | 5/2021 | Gomes et al. |
| 2021/0151438 A1 | 5/2021 | Gomes et al. |
| 2021/0159229 A1 | 5/2021 | Gomes et al. |
| 2021/0193666 A1 | 6/2021 | Gomes et al. |

* cited by examiner

INTEGRATED CIRCUIT ASSEMBLIES WITH DIRECT CHIP ATTACH TO CIRCUIT BOARDS

RELATED APPLICATIONS

This application claims the benefit of and priority from U.S. Provisional Patent Application Ser. No. 63/119,928, titled "INTEGRATED CIRCUIT ASSEMBLIES," filed on Dec. 1, 2020, hereby incorporated by reference in its entirety.

TECHNICAL FIELD

This disclosure relates generally to the field of semiconductor devices, and more specifically, to integrated circuit (IC) assemblies that include microelectronic assemblies of IC structures configured for direct chip attach to circuit boards, as well as related devices, packages, and methods.

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each IC die and each IC package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1A:
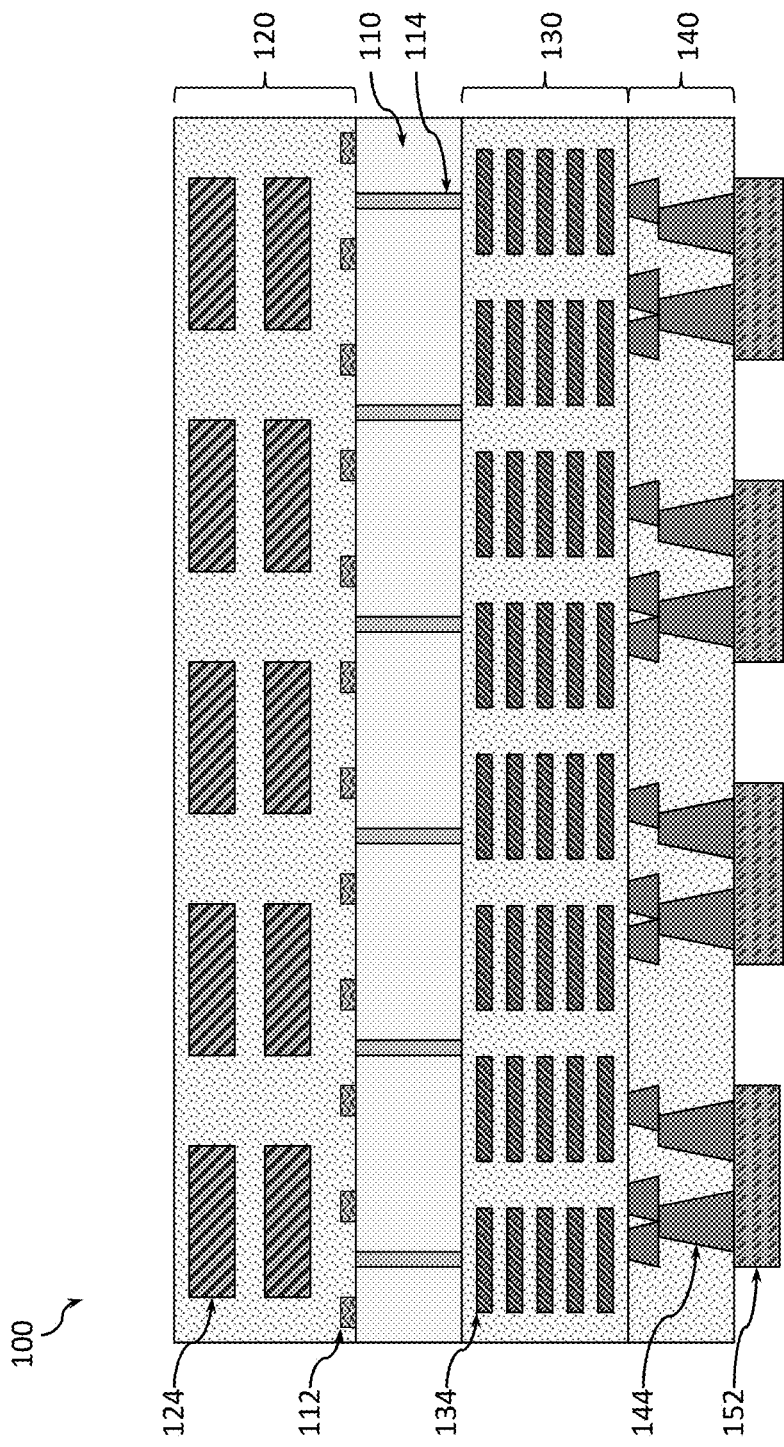
FIGS. 1A-1D provide schematic illustrations of a cross-sectional side view of a microelectronic assembly with a base die configured for direct chip attach to a circuit board using a redistribution layer, in accordance with some embodiments.

The systems, methods, and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating IC assemblies presented herein, described with reference to various microelectronic assemblies configured for direct chip attach to circuit boards, and related methods, devices, and packages (e.g., circuit board packages), it might be useful to first understand phenomena that may come into play during IC manufacturing. The following foundational information may be viewed as a basis from which the present disclosure may be properly explained. Such information is offered for purposes of explanation only and, accordingly, should not be construed in any way to limit the broad scope of the present disclosure and its potential applications.

IC dies are conventionally coupled to a package substrate for mechanical stability and to facilitate connection to other components, such as circuit boards. Package substrates are typically relatively thick, on the order of tens or hundreds of micrometers (microns), resulting in thick final packages (i.e., resulting in packages having a relatively large height). Furthermore, communicating large numbers of signals between a circuit board, via the package substrate, and multiple dies in a multi-die IC package is challenging due to the increasingly small size of such dies, thermal constraints, and power delivery constraints, among others.

Various aspects of the present disclosure set forth IC dies, microelectronic assemblies, as well as related devices and packages, related to direct chip attach of dies and circuit boards. One aspect relates to microelectronic assemblies that include dies configured for direct chip attach to a circuit board (e.g., an attach without a package substrate between a circuit board and a die), without a package substrate between a base die and a circuit board. An example microelectronic assembly according to this aspect may include a die with IC components provided over the front side of the die, and a metallization stack provided over the back side of the die. The die may include die interconnects extending between the front side and the back side of the die, to electrically couple the IC components of the die and interconnects of the metallization stack. The assembly may further include back side conductive contacts, provided over the side of the metallization stack facing away from the die, the back side conductive contacts configured to route signals to and from the IC components via the metallization stack and the die interconnects, and configured to be coupled to respective conductive contacts of a circuit board in absence of a package substrate between the die and the circuit board. Another aspect relates to microelectronic assemblies that include circuit boards configured for direct chip attach to IC dies (e.g., an attach without a package substrate between a circuit board and an IC die). An example microelectronic assembly according to this aspect may include a circuit board and circuit board conductive contacts, provided over the front side of the circuit board, where the circuit board includes a first layer and a second layer, the second layer is between the front side of the circuit board and the first layer, the first layer includes a conductive line, and the second layer includes an insulator material and a conductive via extending through the insulator material. The conductive via has a first end in conductive contact with the conductive line and further has a second end in conductive contact with one of the circuit board conductive contacts. The circuit board conductive contacts are configured to be coupled to respective conductive contacts of a die in absence of a package substrate between the die and the circuit board. Eliminating the need to include a package substrate between a die and a circuit board may significantly decrease the overall height of such assemblies. Various aspects disclosed herein advantageously provide a robust set of implementations that may enable significant improvements in terms of optimizing performance of individual IC dies, microelectronic assemblies including one or more of such dies, and IC packages and devices including one or more of such microelectronic assemblies.

In the following detailed description, various aspects of the illustrative implementations will be described using terms commonly employed by those skilled in the art to convey the substance of their work to others skilled in the art.

For example, unless described otherwise, dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.). The term "circuit" may be used to describe one or more passive and/or active components that are arranged to cooperate with one another to provide a desired function.

In other example, the term "interconnect" may be used to describe any element formed of an electrically conductive material for providing electrical connectivity to one or more components associated with an IC or/and between various such components. In context of an IC die/chip, the term "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of the IC die/chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC die/chip. Sometimes, metal lines and vias may be referred to as "conductive lines/traces" and "conductive vias", respectively, to highlight the fact that these elements include electrically conductive materials such as, but not limited to, metals. On the other hand, in context of a stack of dies coupled to one another or in context of a die coupled to a circuit board, the term "interconnect" may refer to, respectively, to die-to-die (DTD) interconnects and die-to-circuit board (DTCB) interconnects.

In various embodiments, components associated with an IC (i.e., IC components) may include, for example, transistors, diodes, power sources, resistors, capacitors, inductors, sensors, transceivers, receivers, antennas, etc. In various embodiments, components associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed as part of a chipset for executing one or more related functions in a computer.

As used herein, the terms "die" and "IC die" are synonymous, as are the terms "component" and "IC component," the terms "circuit" and "IC circuit," or the terms "package" and "IC package." The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). The terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. Although certain elements may be referred to in the singular herein, such elements may include multiple sub-elements. For example, "an electrically conductive material" may include one or more electrically conductive materials. In another example, a "dielectric material" may include one or more dielectric materials.

The description uses phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 1A-1D, such a collection may be referred to herein without the letters, e.g., as "FIG. 1."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of signal lines in a metallization stack, or a certain number of conductive contacts of a circuit board, etc.), this is simply for ease of illustration, and more, or less, than that number may be included in microelectronic assemblies and related devices/packages according to various embodiments of the present disclosure. Still further, various views shown in some of the drawings are intended to show relative arrangements of various elements therein. In other embodiments, various microelectronic assemblies configured for direct chip attach to circuit boards and related devices/packages, or portions thereof, may include other elements or components that are not illustrated (e.g., transistor portions, various components that may be in electrical contact with any of the illustrated components of the microelectronic assemblies and related devices/packages, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more microelectronic assemblies configured for direct chip attach to circuit boards and related devices/packages as described herein.

Configuring Microelectronic Assemblies for Direct Chip Attach

Figure 2:
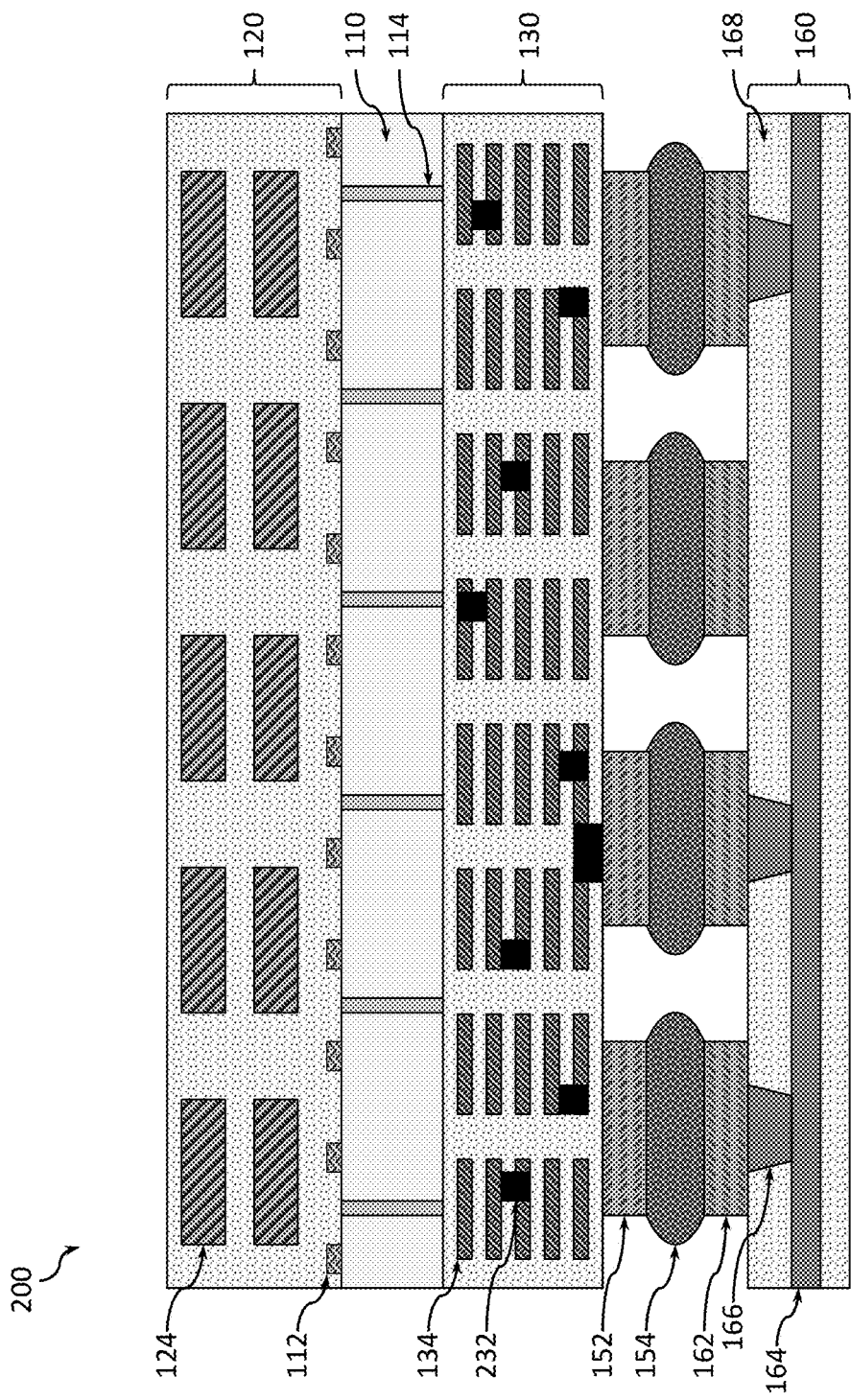
FIG. 2 provides a schematic illustration of a cross-sectional side view of a microelectronic assembly with a base die configured for direct chip attach to a circuit board using backend transistors in a back side metallization stack, in accordance with some embodiments.
Figure 3:
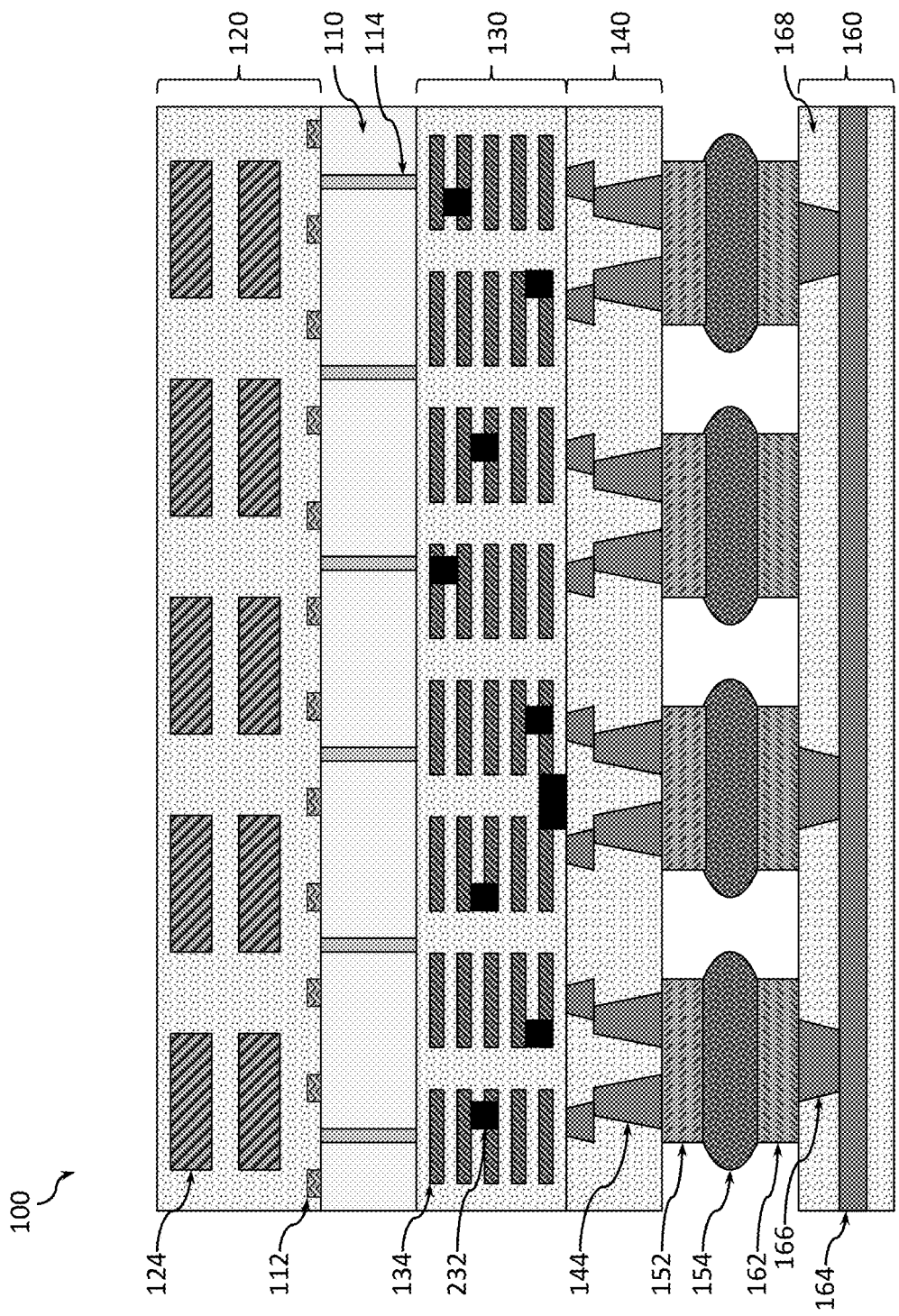
FIG. 3 provides a schematic illustration of a cross-sectional side view of a microelectronic assembly with a base die configured for direct chip attach to a circuit board using a redistribution layer and backend transistors in a back side metallization stack, in accordance with some embodiments.

Various embodiments of the present disclosure are based on a number of recognitions. One recognition is that a metallization stack may be provided on the back side of a die (i.e., a back side metallization stack), the metallization stack including a plurality of interconnects (e.g., lines and vias) configured to route signals to/from one or more ICs of the die. Another recognition is that directly attaching such a die to a circuit board is not trivial because the size and the pitch of the signal lines of such a metallization stack are likely to be rather different (typically, smaller) then those of the conductive contacts of the circuit board. To address the differences in size and pitch, according to some embodiments of the present disclosure, a redistribution layer (RDL) between the back side metallization stack and the conductive contacts to the circuit board may be used, e.g., as shown in FIG. 1. According to other embodiments, one or more backend transistors may be implemented in the back side metallization stack to reconfigure electrical connectivity and address the differences in size and pitch of the signal lines in the back side metallization stack and the conductive contacts of the circuit board, e.g., as shown in FIG. 2. In some embodiments, both an RDL and backend transistors may be implemented to address the differences in size and pitch, e.g., as shown in FIG. 3.

FIGS. 1A-1D provide schematic illustrations of a cross-sectional side view of a microelectronic assembly 100 with a base die configured for direct chip attach using an RDL, in accordance with some embodiments. As shown in FIG. 1A, the microelectronic assembly 100 may include a base die 110, a front side metallization stack 120 having power lines 124, a back side metallization stack 130 having signal lines 134, an RDL 140 having RDL interconnects 144, and a plurality of back side conductive contacts 152. The face of the base die 110 that is closest to the front side metallization stack 120 is referred to as the "front side" of the base die 110, while the face of the base die 110 that is closest to the back side metallization stack 130 is referred to as the "back side" of the base die 110. Thus, the back side of the base die 110 is opposite its front side.

The base die 110 may be a semiconductor substrate composed of semiconductor material systems including, for example, N-type or P-type materials systems. In one implementation, the base die 110 may be a crystalline substrate formed using a bulk silicon or a silicon-on-insulator (SOI) substructure. In other implementations, the base die 110 may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the base die 110 may be non-crystalline. In some embodiments, the base die 110 may be a printed circuit board (PCB) substrate. Although a few examples of materials from which the base die 110 may be formed are described here, any material that may serve as a foundation upon which IC components 112 as described herein may be built falls within the spirit and scope of the present disclosure.

As schematically illustrated in FIG. 1A, a plurality of IC components 112 may be provided over the front side of the base die 110. In some embodiments, the IC components 112 may include frontend components (i.e., IC components provided in a front-end-of line (FEOL) process), e.g., frontend transistors. In some embodiments, the IC components 112 may include backend components (i.e., IC components provided in a back-end-of line (BEOL) process), e.g., backend transistors. Generally, frontend transistors are transistors for which the active semiconductor channel material is typically a part of a semiconductor substrate, e.g., a part of a silicon wafer. On the other hand, backend transistors are transistors for which the active semiconductor channel material is not a part of the semiconductor substrate. For example, backend transistors may be implemented as thin-film transistors (TFTs), where a TFT is a special kind of a field-effect transistor made by depositing a thin-film of an active semiconductor material, as well as a dielectric layer and metallic contacts, over a support layer (or, simply, a "support") that may be a non-conducting layer. At least a portion of the active semiconductor material forms a channel of the TFT.

For all backend transistors described herein, e.g., those that may be implemented as at least a part of the IC components 112 or those that may be implemented in the back side metallization stack 130, as described below with reference to FIG. 2, if backend transistors are implemented as TFTs, the channel material of such backend transistors may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, for TFTs, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of TFTs may have a thickness between about 5 and 75 nanometers, including all values and ranges therein. In some embodiments, a thin-film channel material of TFTs may be deposited at relatively low temperatures, which allows depositing the channel material within the thermal budgets imposed on backend fabrication to avoid damaging other components, e.g., frontend components such as the logic devices of the IC components 112.

In some embodiments, the IC components 112 may include both frontend and backend transistors. For example, the base die 110 may be a memory die arranged as a "compute-under-array" because the compute logic needed to control the memory array is implemented in the FEOL layer (e.g., as the frontend IC components 112), which is under the memory array implemented by memory cells of the BEOL layers (i.e., memory cells implemented using backend transistors) of the base die 110. In such an example, the memory control logic implemented by the frontend transistors of the IC components 112 may, e.g., include logic transistors configured to form sense amplifiers, multipliers, CMOS logic, and possibly static random-access memory (SRAM) devices configured to control operation of the memory cells of the BEOL layers of the base die 110 (i.e., configured to control operation of the memory cells implemented by the backend transistors of the IC components 112). In various embodiments, the base die 110 may be a compute die, a memory die, or a die that includes both compute ICs and memory ICs, at least some of which implemented with the IC component 112.

As shown in FIG. 1A, the base die 110 may include a plurality of base die interconnects 114, extending between the front side and the back side of the base die 110 and configured to provide electrical connectivity between the IC components 112 and back side interconnects of the back side metallization stack 130. As shown in FIG. 1A, in some embodiments, the base die interconnects 114 may be implemented as through-silicon vias (TSVs), i.e., vias extending between the front side and the back side of the base die 110. A pitch (e.g., measured as a center-to-center distance) of the base die interconnects 114 implemented as TSVs may be between about 2 and 12 micron, including all values and ranges therein, e.g., between about 4 and 9 micron. In some embodiments, cross-sectional dimensions (e.g., diameters or widths) of the base die interconnects 114 implemented as TSVs may be between about 2 and 4 micron, including all values and ranges therein, e.g., about 3 micron. In some embodiments, the cross-sectional dimensions of the base die interconnects 114 implemented as TSVs may be between about 35% and 65%, e.g., between about 45% and 55%, of the pitch of these TSVs. In some embodiments, the base die interconnects 114 may be arranged in a grid-like manner in the base die 110.

In some embodiments, the base die interconnects 114 may be referred to as "signal vias" 114 in that they are configured to communicate signals to, from, or between various IC components 112 (e.g., transistors, resistors, capacitors, interconnects, etc.) of the base die 110. For example, the base die interconnects 114 may communicate signals to/from/between transistors implementing memory cells if the base die 110 is a memory chiplet, or to, from, or between transistors implementing compute logic if the base die 110 is a compute chiplet. However, in various embodiments, the base die interconnects 114 may also include interconnects other than vias, as long as they can route signals between the IC components 112 and the back side conductive contacts 152 via the signal lines 134 of the back side metallization stack 130. To that end, individual ones of the back side conductive contacts 152 may be electrically coupled to one or more of the signal lines 134, the one or more of the signal lines 134 may be electrically coupled to one or more of the base die interconnects 114, and the one or more of the base die interconnects 114 may be electrically coupled to one or more of the IC components 112.

Turning to the front side and the back side metallization stacks 120, 130, providing a plurality of the power lines 124 in the front side metallization stack 120 while providing a plurality of the signal lines 134 in the back side metallization stack 130 allows routing power to the IC components 112 from the front side of the base die 110, while routing signals to/from the IC components 112 from the back side of the base die 110. In various embodiments, the front side metallization stack 120 may include power interconnects other than lines (e.g., vias configured to route power to the IC components 112), and, similarly, the back side metallization stack 130 may include signal interconnects other than lines (e.g., vias configured to route signals to/from the IC components 112).

In some embodiments, a pitch of the power interconnects in the microelectronic assembly 100 (e.g., a pitch of the power lines 124 in the front side metallization stack 120) may be between about 10 and 25 micron, including all values and ranges therein, e.g., between about 15 and 20 micron. In some embodiments, cross-sectional dimensions (e.g., widths of the conductive lines or diameters of the conductive vias) of the power interconnects in the microelectronic assembly 100 (e.g., a pitch of the power lines 124 in the front side metallization stack 120) may be between about 7 and 11 micron, including all values and ranges therein, e.g., about 9 micron. In some embodiments, the cross-sectional dimensions of the power interconnects may be between about 35% and 65%, e.g., between about 45% and 55%, of the pitch of these interconnects.

The pitch and cross-sectional dimensions of the signal interconnects in the microelectronic assembly 100 may be smaller than those of the power interconnects. In some embodiments, a pitch of the signal interconnects in the microelectronic assembly 100 (e.g., a pitch of the signal lines 134 in the back side metallization stack 130) may be between about 100 and 250 nanometers, including all values and ranges therein, e.g., between about 150 and 200 nanometers. In some embodiments, cross-sectional dimensions (e.g., widths of the conductive lines or diameters of the conductive vias) of the signal interconnects in the microelectronic assembly 100 (e.g., a pitch of the signal lines 134 in the back side metallization stack 130) may be between about 35% and 65%, e.g., between about 45% and 55%, of the pitch of these interconnects.

FIG. 1A further illustrated the RDL 140 with the RDL interconnects 144. As shown in FIG. 1A, the RDL 140 may be provided over the back side metallization stack 130, so that the RDL 140 is between the back side metallization stack 130 and the back side conductive contacts 152. In such embodiments, the RDL interconnects 144 may be configured to electrically couple individual ones of the back side conductive contacts 152 to one or more of the signal lines 134 in the back side metallization stack 130. In some embodiments, the individual ones of the back side conductive contacts 152 may be in conductive contact with one or more of the RDL interconnects 144. The RDL 140 may have two opposing faces. For example, the first face of the RDL 140 may be facing the back side metallization stack 130 and may be closer to the back side metallization stack 130 than the second side of the RDL 140). In some embodiments, the RDL interconnects 144 may include first RDL interconnects and second RDL interconnects. In such embodiments, the RDL 140 may include first RDL interconnects at the first face of the RDL 140 (i.e., at the face that is facing the back side metallization stack 130) and include second RDL interconnects at the second face of the RDL 140. The first RDL interconnects may be coupled to individual ones of the signal lines 134 of the back side metallization stack 130, while the second RDL interconnects may be coupled to individual ones of the back side conductive contacts 152.

The RDL interconnects 144 are configured to couple individual ones of the signal lines 134 to different ones of the back side conductive contacts 152 so that signals can be routed between the back side conductive contacts 152 and the IC components 112 via the signal lines 134. In particular, the RDL interconnects 144 are configured to electrically couple various components to address the differences in size and pitch of the signal lines 134 and the back side conductive contacts 152. As shown in FIG. 1A, the pitch and cross-sectional dimensions of the signal interconnects in the microelectronic assembly 100 may be smaller than those of the back side conductive contacts 152, e.g., at least about 10 times smaller or at least about 100 times smaller. For example, the pitch of the signal lines 134 may be between about 100 nm and 250 nm, including all values and ranges therein, while the pitch of the back side conductive contacts 152 may be between about 150 and 250 micron, including all values and ranges therein. In some embodiments, the widths of the back side conductive contacts 152 and the widths of the signal lines 134 may be between about 35% and 65%, e.g., between about 45% and 55%, of their respective pitches.

Figure 1B:
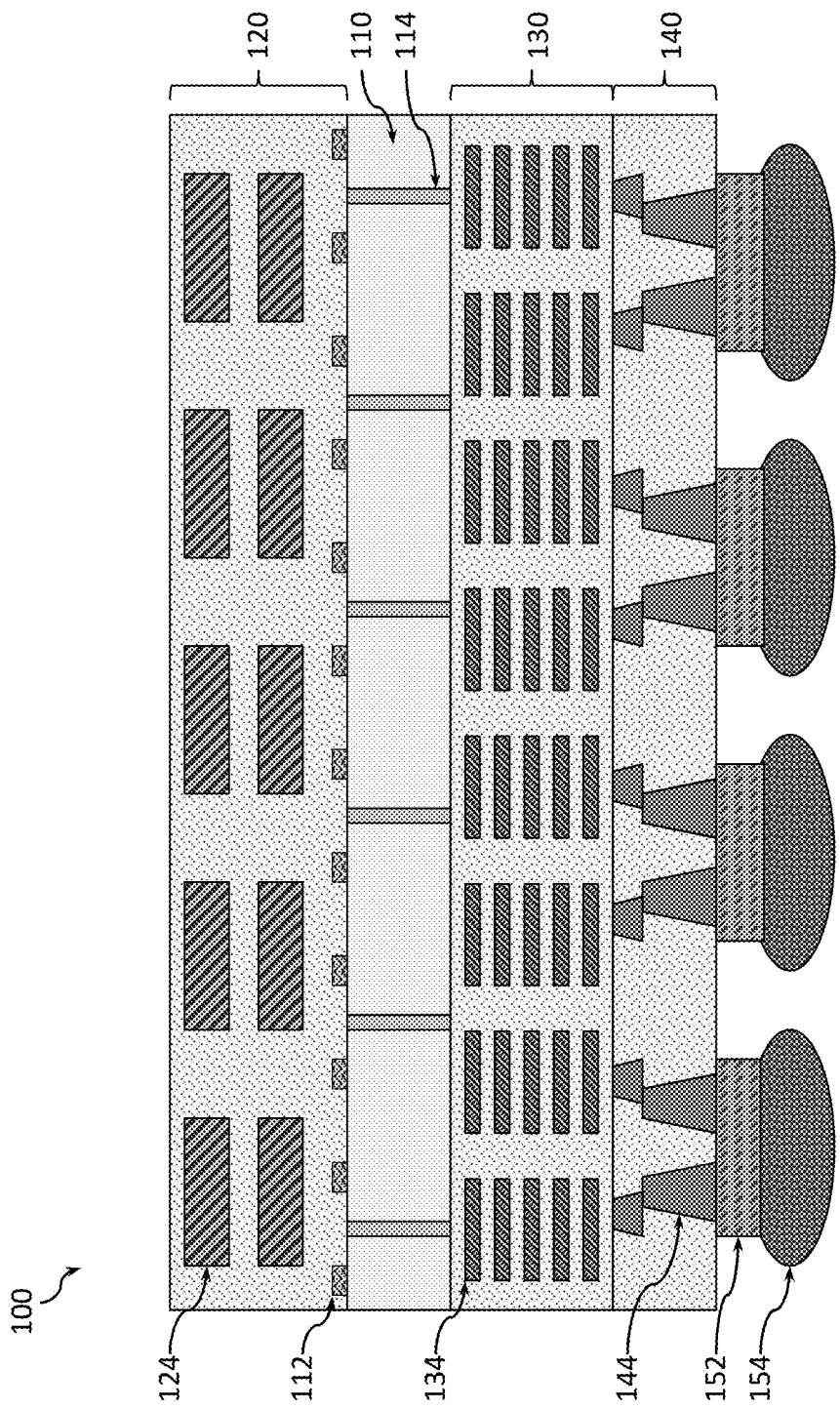
Figure 1C:
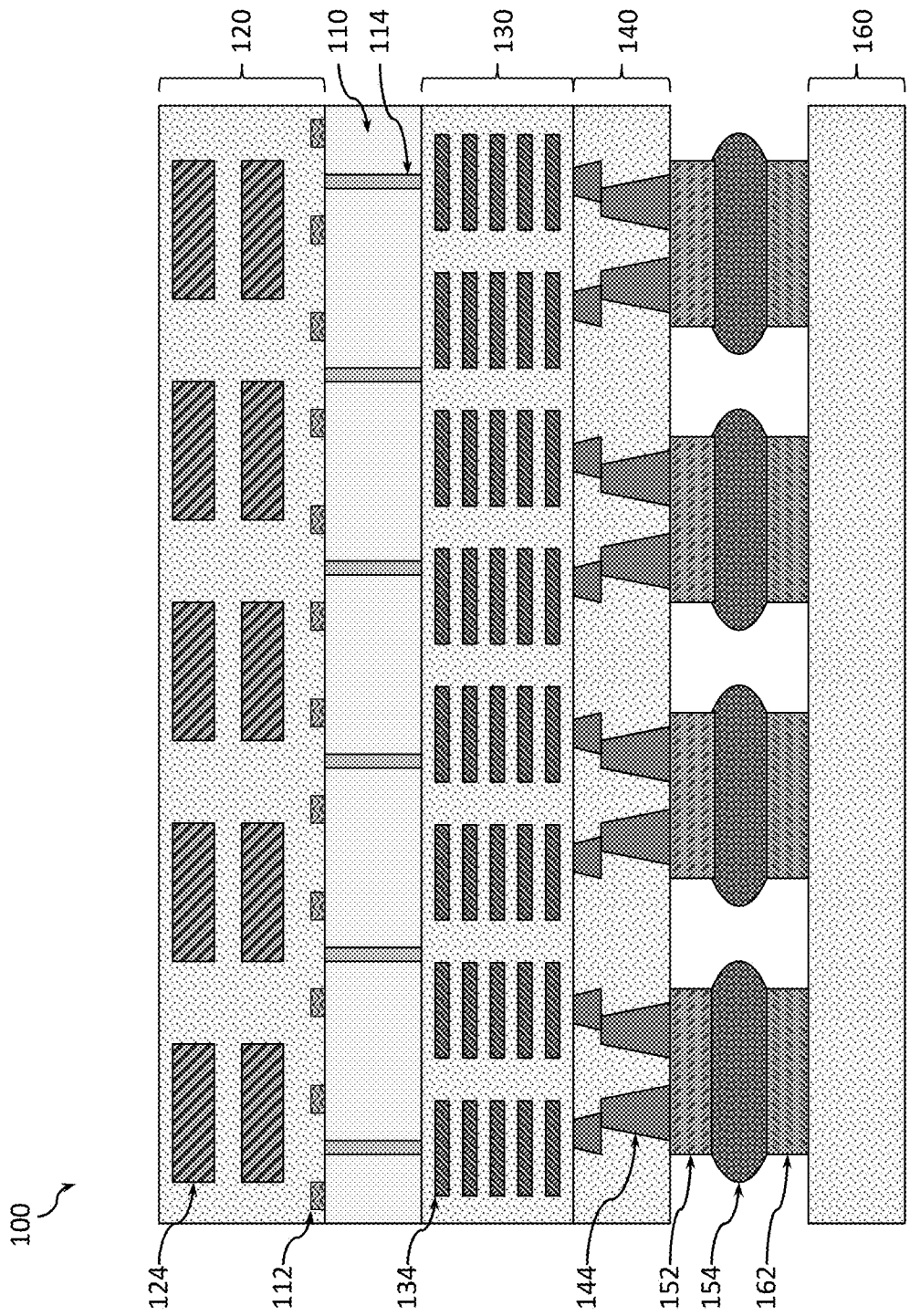

Turning to other details of the back side conductive contacts 152, the back side conductive contacts 152 may be implemented as electrically conductive pads or posts, e.g., copper pads or posts, configured to route signals to and from the IC components 112, via the back side metallization stack 130 and the base die interconnects 114. In some embodiments, the microelectronic assembly 100 may further include solder in conductive contact with the respective ones of the back side conductive contacts 152. Such solder is illustrated in FIG. 1B, showing the microelectronic assembly 100 substantially as in FIG. 1A, except that the microelectronic assembly 100 of FIG. 1B further includes solder bumps (or solder balls) 154, with a designated solder bump 154 provided over each of the back side conductive contacts 152. The back side conductive contacts 152 may be configured to be coupled to a circuit board (e.g., a motherboard, e.g., a PCB), e.g., a circuit board 160, as shown in FIG. 1C, and configured to route signals between the circuit board 160 and the IC components 112 of the base die 110. In particular, as shown in FIG. 1C, the back side conductive contacts 152 may be configured to be coupled to the circuit board 160 in absence of a package substrate between the back side metallization stack 130 and the circuit board 160. The solder bumps 154 may be subject to a thermal reflow to form DTCB interconnects. FIG. 1C shows the microelectronic assembly 100 substantially as in FIG. 1B, except that the microelectronic assembly 100 of FIG. 1C further includes the circuit board 160, as well as circuit board conductive contacts 162, provided over the face of the circuit board 160 that is facing the back side conductive contacts 152. The DTCB interconnects, provided by the solder bumps 154, may be configured to electrically and mechanically couple individual ones of the circuit board conductive contacts 162 and the respective ones of the back side conductive contacts 152, e.g., as shown in FIG. 1C.

Similar to the conductive contacts 152, the conductive contacts 162, as well as any other conductive contacts described herein (e.g., those described with reference to FIG. 4), may be implemented as conductive pads or posts, e.g., as copper pads or posts.

The solder of the solder bumps 154 may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTCB interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

In some embodiments, the solder bumps 154 may use a lower-temperature solder (e.g., with a melting point below 200 degrees Celsius). In some embodiments, a lower-temperature solder may include tin and bismuth (e.g., eutectic tin bismuth) or tin, silver, and bismuth. In some embodiments, a lower-temperature solder may include indium, indium and tin, or gallium. In other embodiments, the solder bumps 154 may use a higher-temperature solder (e.g., with a melting point above 200 degrees Celsius). In some embodiments, a higher-temperature solder may include tin; tin and gold; or tin, silver, and copper (e.g., 96.5% tin, 3% silver, and 0.5% copper).

Figure 4:
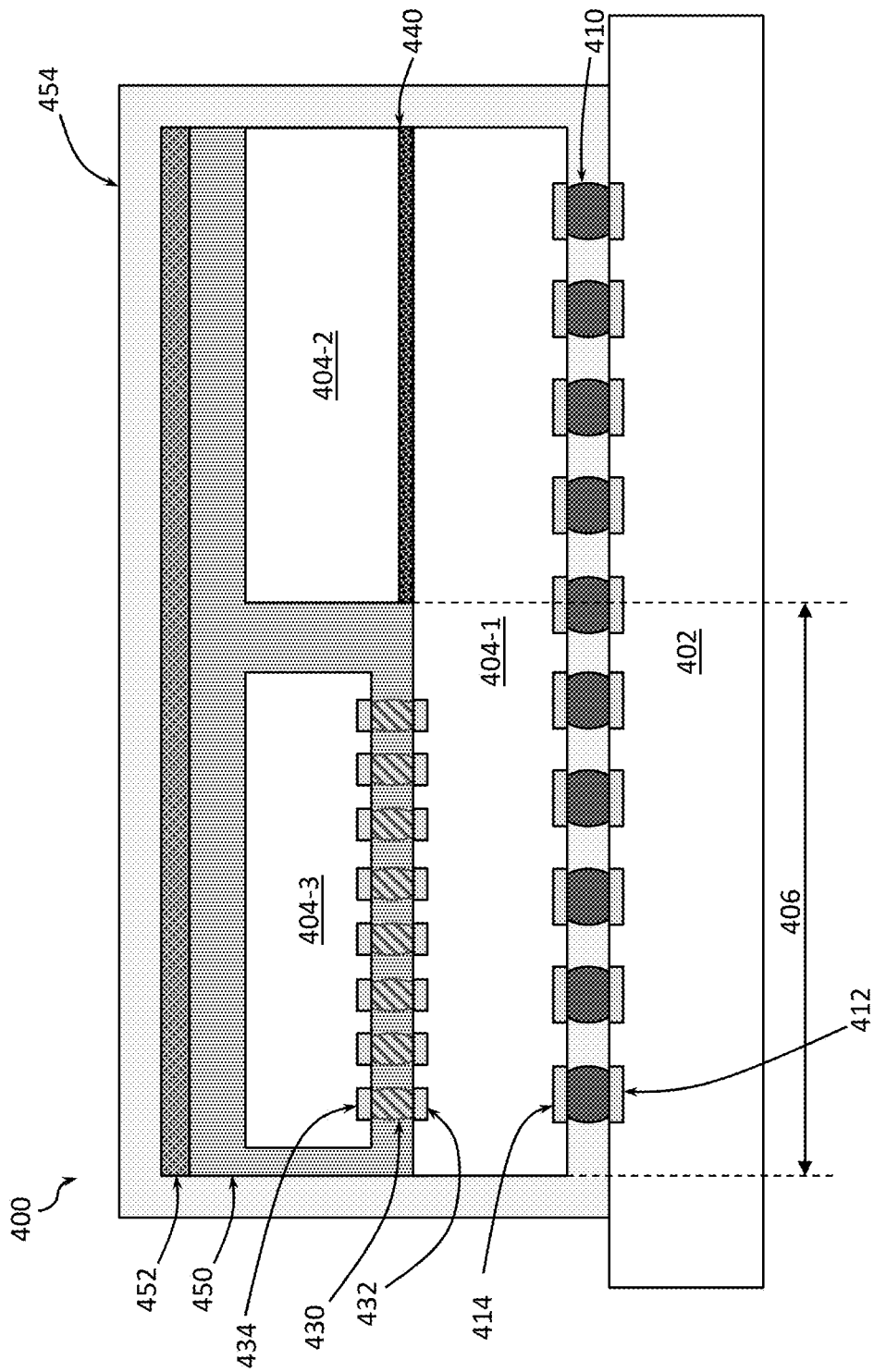
FIG. 4 illustrates an example of an IC device assembly package with a microelectronic assembly with a base die configured for direct chip attach to a circuit board, in accordance with some embodiments.

One of the reasons why the pitch of the back side conductive contacts 152 is larger than the pitch of the signal lines 134 is that the pitch of the solder bumps 154 should be relatively large if the solder bumps 154 are to couple the base die 110 to the circuit board 160, which is due to the differences in materials used on either side of the solder bumps 154 (thus, the pitch of the signal lines 134 is also smaller than the pitch of the solder bumps 154). In particular, the differences in the material composition of the base die 110 (as well as any further dies coupled thereto) and the circuit board 160 may result in differential expansion and contraction of the base die 110 and the circuit board 160 due to heat generated during operation (as well as the heat applied during various manufacturing operations). To mitigate damage caused by this differential expansion and contraction (e.g., cracking, solder bridging, etc.), the DTCB interconnects in any of the microelectronic assemblies or IC packages as described herein may be formed larger and farther apart than, e.g., any of DTD interconnects, which may experience less thermal stress due to the greater material similarity of the pair of dies on either side of the DTD interconnects. In some embodiments, the DTCB interconnects disclosed herein may have a pitch between about 80 microns and 300 microns, while the DTD interconnects disclosed herein may have a pitch between about 7 microns and 100 microns. Example of the DTD interconnects is shown in FIG. 4, described below.

In some embodiments, the circuit board 160 may be a motherboard. In some embodiments, the circuit board 160 may be a PCB. In some embodiments, the circuit board 160 may be a lower density medium and the base die 110 (or any further dies included in the microelectronic assembly 100) may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

Figure 1D:
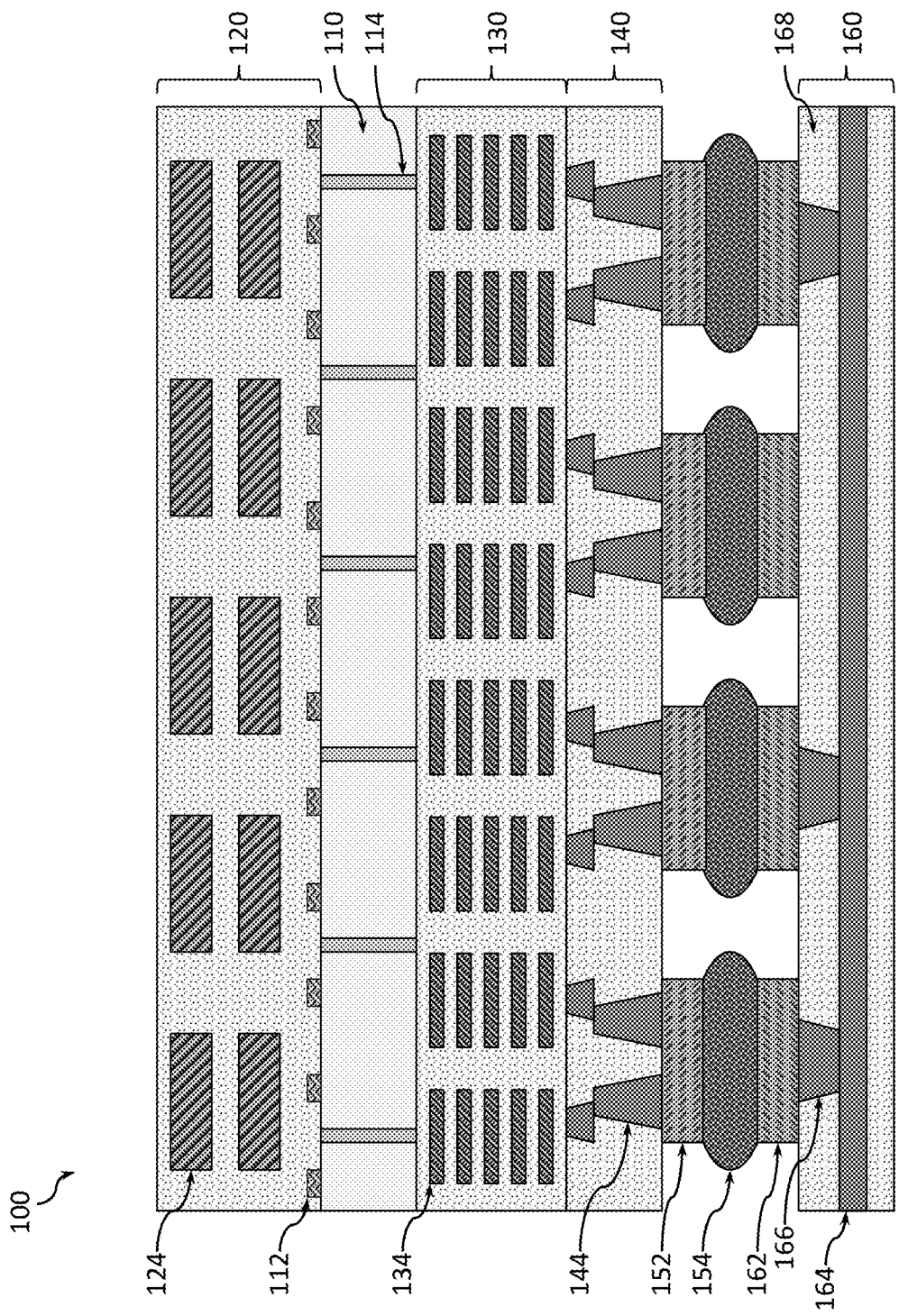

In some embodiments, the circuit board 160 may be different from conventional PCBs. An example of this is illustrated in FIG. 1D, showing the microelectronic assembly 100 substantially as in FIG. 1C, except that the circuit board 160 of FIG. 1D further includes one or more conductive lines 164, provided in a first layer of the circuit board 160, and one or more conductive vias 166, provided in a second layer of the circuit board 160 (where the second layer is above the first layer or, phrased differently, is between the second layer and the circuit board conductive contacts 162). As shown in FIG. 1D, the second layer of the circuit board 160 may include an insulator material 168, and the conductive vias 166 extend through the insulator material 168 to the top surface of the circuit board 160, to make conductive contact with the respective circuit board conductive contacts 162. As is shown in FIG. 1D, individual ones of the circuit board conductive contacts 162 may overlap and be in conductive contact with respective ones of the circuit board conductive vias 166 (thus, individual ones of the conductive vias 166 may be under respective ones of the circuit board conductive contacts 162). This means that the one or more conductive lines 164 of the circuit board 160 are buried conductive lines (e.g., because they are not at the face of the circuit board 160 over which circuit board conductive contacts 162 are provided, but, rather, are buried under the insulator material 168 of the second layer of the circuit board 160). This is in sharp contrast to conventional implementations of circuit boards, where the conductive lines 164 would typically be at the top surface of the circuit board, the surface over which the circuit board conductive contacts 162 are provided. For the circuit board 160 of FIG. 1D, only the conductive vias 166 reach the top surface of the circuit board 160 and make conductive contact to the circuit board conductive contacts 162. Providing the conductive vias 166 reaching to the top of the circuit board 160 to the circuit board conductive contacts 162, as shown in FIG. 1D, may be advantageous in terms of reducing the parasitic effects that may be associated with IC packages (e.g., with conventional circuit boards). In some embodiments, the insulator material 168 may be epoxy. In some embodiments, there may be no solder resist material under the die 110. Although FIG. 1D illustrates one continuous conductive line 164, in other embodiments, the buried layer of the circuit board 160 as shown in FIG. 1D may include multiple conductive lines 164. An individual conductive via 166 may, then have a first end in conductive contact with one of the conductive lines 164 and having a second end in conductive contact with one of the circuit board conductive contacts 162. In some embodiments, a pitch of the conductive vias 166 may be between about 150 and 250 micron, e.g., between about 190 and 230 micron, e.g., about 210 micron. In some embodiments, a height of the conductive vias 166 may be between about 0.5 and 20 micron, e.g., between about 1 and 15 micron.

Figure 6:
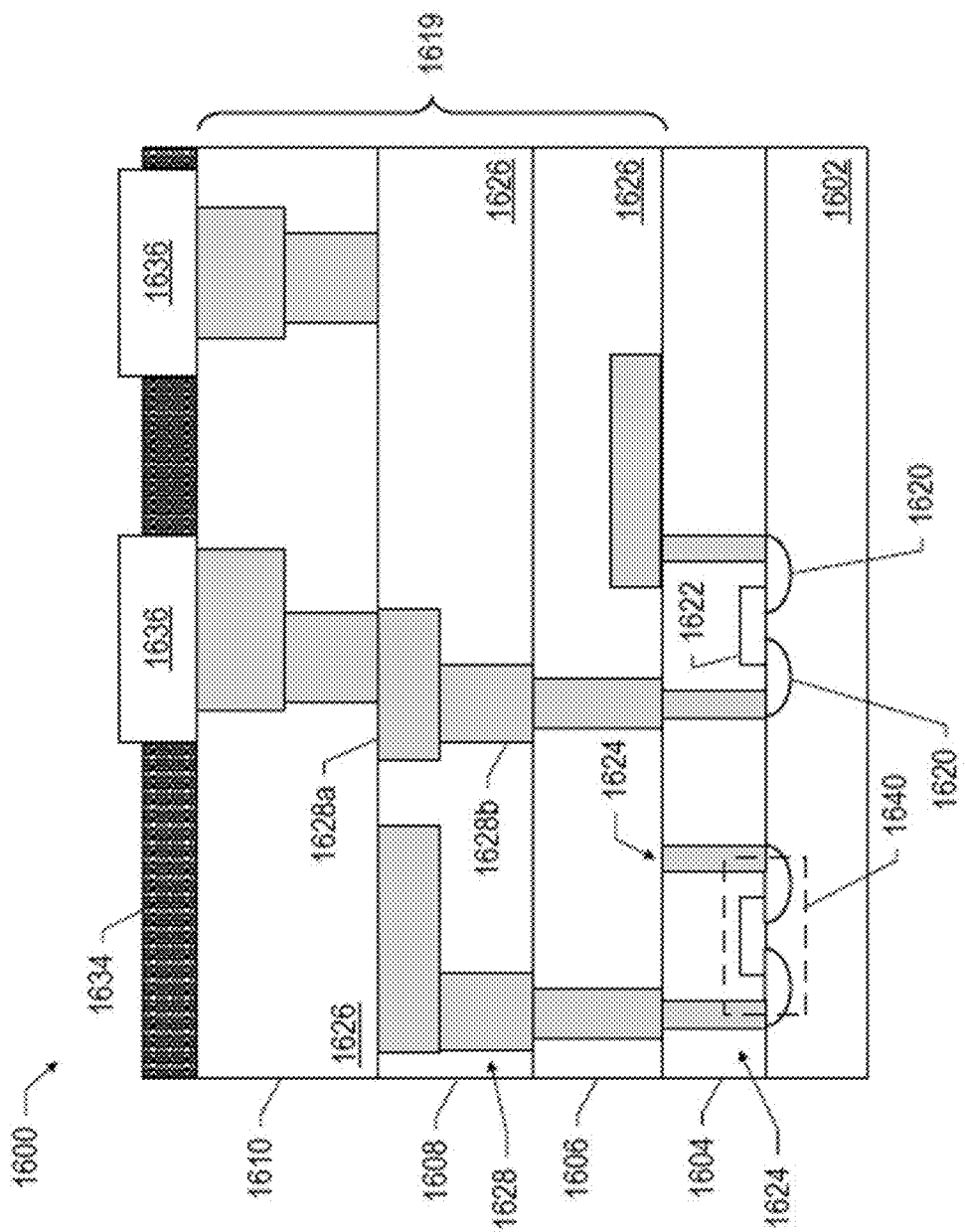
FIG. 6 is a cross-sectional side view of an IC device that may be included in one or more dies configured for direct chip attach to circuit boards, in accordance with some embodiments.

An identical pattern shown in FIG. 1 to surround various interconnects in each of the front side metallization stack 120, the back side metallization stack 130, and the RDL 140 illustrates an insulator material configured to provide electrical isolation between various interconnects, as typically used in metallization stacks (e.g., similar to the dielectric material 1626, shown in FIG. 6). In various embodiments, such an insulator material may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used as the insulator material in the front side metallization stack 120, the back side metallization stack 130, and the RDL 140 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Examples of the low-k dielectric materials that may be used as the insulator material in the front side metallization stack 120, the back side metallization stack 130, and the RDL 140 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the insulator material in the front side metallization stack 120, the back side metallization stack 130, and the RDL 140 include organic polymers such as polyimide, polynorbornenes, benzocyclobutene, perfluorocyclobutane, or polytetrafluoroethylene (PTFE). Still other examples of low-k dielectric materials that may be used as the insulator material in the front side metallization stack 120, the back side metallization stack 130, and the RDL 140 include silicon-based polymeric dielectrics such as hydrogen silsesquioxane (HSQ) and methylsilsesquioxane (MSQ). Other examples of low-k materials that may be used as the insulator material in the front side metallization stack 120, the back side metallization stack 130, and the RDL 140 include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. In some embodiments, the insulator materials used in the front side metallization stack 120, the back side metallization stack 130, and the RDL 140 may have substantially the same material composition. In other embodiments, the insulator materials of these portions may have different material compositions.

FIG. 2 provides a schematic illustration of a cross-sectional side view of a microelectronic assembly 200 with a base die configured for direct chip attach using backend transistors 232 in a back side metallization stack, in accordance with some embodiments. The microelectronic assembly 200 is substantially as the microelectronic assembly 100 of FIG. 1D, except that it does not include the RDL 140 that was included in the microelectronic assembly 100 of FIG. 1D, and except that the microelectronic assembly 200 further includes the backend transistors 232. When the RDL 140 is not included, the back side conductive contacts 152 may be coupled directly (e.g., be in conductive contact with) some of the signal lines 134. The backend transistors 232 may serve as reconfigurable interconnects in that, depending on the voltage applied to their gates, they may enable or disable conductive paths between various ones of the signal lines 134. In particular, the backend transistors 232 in the back side metallization stack 130 may be configured to electrically couple individual ones of the back side conductive contacts 152 to one or more of the signal lines 134 in the back side metallization stack 130. In this manner, the backend transistors 232 may serve to increase the pitch for routing signals to/from the IC components 112 from the smaller pitch of the signal lines 134 to the larger pitch of the back side conductive contacts 152 and the DTCB interconnects provided by the solder bumps 154 in a way that allows dynamic variability of various electrical connections. In some embodiments, the backend transistors 232 may be implemented as TFTs, e.g., as any of the TFTs described above. In other embodiments, the backend transistors 232 may be implemented using silicon transfer, a process where a layer of a semiconductor material suitable to form a basis for an active channel material of a transistor (e.g., such material being silicon) is grown elsewhere (e.g., using epitaxial growth), and then transferred into the back side metallization stack 130 so that the backend transistor 232 may be formed with this transferred layer forming basis for the channel material.

Although FIG. 2 illustrates the circuit board 160 as being implemented with the conductive lines 164 and conductive vias 166 as described above, in other embodiments, the microelectronic assembly 200 may include a conventional circuit board instead of the circuit board 160 as shown in FIG. 2.

In still further embodiments, a microelectronic assembly may include both the RDL 140 as described with reference to FIG. 1 and the backend transistors 232 as described with reference to FIG. 2 to increase the pitch for routing signals to/from the IC components 112 from the smaller pitch of the signal lines 134 to the larger pitch of the back side conductive contacts 152 and the DTCB interconnects provided by the solder bumps 154. A microelectronic assembly 300 shown in FIG. 3 provides one example of such further embodiments. The microelectronic assembly 300 is substantially the same as the microelectronic assembly 100 of FIG. 1D, except that it further includes the backend transistors 232 as in the microelectronic assembly 200 of FIG. 2.

Although FIG. 3 illustrates the circuit board 160 as being implemented with the conductive lines 164 and conductive vias 166 as described above, in other embodiments, the microelectronic assembly 300 may include a conventional circuit board instead of the circuit board 160 as shown in FIG. 3.

It should be noted that, while the embodiments shown in the present drawings illustrate and describe the power lines 124 implemented in the front side metallization stack 120 and the signal lines 134 implemented in the back side metallization stack 130, in other embodiments, this may be reversed, i.e., the power lines 124 may be implemented in the back side metallization stack 130 and the signal lines 134 may be implemented in the front side metallization stack 120. In such embodiments, the base die 110 may be coupled to the circuit board in a flip-chip configuration, e.g., where the side of the base die 110 over which the IC components 112 are provided and, in this embodiment, the side over which the signal lines 134 are provided, are facing the circuit board 160.

Example IC Package

FIG. 4 illustrates an example of an IC device assembly package 400 with a microelectronic assembly with a base die configured for direct chip attach, in accordance with some embodiments.

As shown in FIG. 4, the package 400 may include a circuit board 402 and one or more dies 404 (with the example embodiment shown illustrating three dies 404, labeled as dies 404-1 through 404-3). As shown in FIG. 4, the circuit board 402 may be coupled to the die 404-1 by DTCB interconnects 410. In particular, the top surface of the circuit board 402 may include a set of conductive contacts 412, and the bottom surface of the die 404-1 may include a set of conductive contacts 414. The conductive contacts 414 at the bottom surface of the die 404-1 may be electrically and mechanically coupled to the conductive contacts 412 at the top surface of the circuit board 402 by the DTCB interconnects 410. The conductive contacts 412, 414, as well as any of the conductive contacts described above, may include bond pads, posts, or any other suitable conductive contacts, for example. The circuit board 402 may be implemented as the circuit board 160, the first die 404-1 may be implemented as the base die 110, the conductive contacts 412 may be implemented as the conductive contacts 162, the conductive contacts 414 may be implemented as the conductive contacts 152, and the DTCB interconnects 410 may be implemented as the DTCB interconnects (e.g., solder bumps) 154, as described above.

The DTCB interconnects 410 illustrated in FIG. 4 are shown to represent solder balls (e.g., for a ball grid array arrangement), but any suitable DTCB interconnects 410 may be used (e.g., pins in a pin grid array arrangement or lands in a land grid array arrangement) in other embodiments of the IC package 400. The circuit board 402 may be a motherboard, for example, and may have other components attached to it (not shown). The circuit board 402 may include conductive pathways and other conductive contacts (not shown) for routing power, ground, and signals through the circuit board 402, as known in the art.

In general, in various embodiments of the IC package 400, the different dies 404 may include any suitable circuitry. For example, in some embodiments, the die 404-1 may be an active or passive die, and the die 404-2 may include one or more of I/O circuitry, high-bandwidth memory, eDRAM, etc. For example, in some embodiments, the die 404-1 may include a power delivery circuitry and the die 404-2 may include a memory device, e.g., a high-bandwidth memory device, or, in other embodiments, the die 404-1 may include I/O circuitry and the die 404-2 may include a field programmable gate array logic. In some embodiments, any of the dies 404 may include one or more device layers including transistors.

In some embodiments, one of the dies 404-1 and 404-2 may have a smaller footprint than the other, e.g., shown in the example of FIG. 4 with the die 404-2 being narrower than the die 404-1. For example, in some embodiments, a width of the die 404-1 may be larger than a width of the die 404-2 by a distance 406. In some embodiments, the distance 406 may be between about 0.5 millimeters and 5 millimeters (e.g., between about 0.75 millimeters and 4 millimeters, or approximately 1 millimeter). Although the die 404-2 is shown to be aligned with the die 404-1 on the right side, there does not have to be such alignment in various embodiments of the IC packages 400 and in various embodiments of the microelectronic assemblies as described herein.

In some embodiments, the die 404-1 of the IC package 400 as described herein may be a double-sided (or "multi-level," or "omni-directional") die in the sense that the die 404-1 has conductive contacts 414 on one surface and further conductive contacts 432 on the opposing surface, as is shown in FIG. 4. In other embodiments, the die 404-1 of the IC package 400 as described herein may be a single-sided die in the sense that the die 404-1 only has conductive contacts 414 on a single surface and no contacts 432 on the opposing surface, not shown in FIG. 4.

In some embodiments, the IC package 400 may include at least two dies 404 that are coupled by DTD interconnects. This is illustrated in FIG. 4 with the die 404-1 being coupled to the die 404-3 by DTD interconnects 430. In particular, the top surface of the die 404-1 may include a set of conductive contacts 432, and the bottom surface of the die 404-3 may include a set of conductive contacts 434. One or more of the conductive contacts 434 at the bottom surface of the die 404-3 may be electrically and mechanically coupled to some of the conductive contacts 432 at the top surface of the die 404-1 by the DTD interconnects 430. FIG. 4 illustrates that the pitch of the DTD interconnects 430 may be different from the pitch of the DTCB interconnects 410 in some embodiments (in other embodiments, these pitches may be substantially the same). In some embodiments, the die 404-3 of the IC package 400 may be a single-sided die (in the sense that the die 404-3 only has conductive contacts 434 on a single surface), as shown in FIG. 4. In other embodiments (not specifically shown), the die 404-3 of the IC package 400 as described herein may be a double-sided die (in the sense that the die 404-3 has conductive contacts 434 on one surface and further conductive contacts on the opposing surface, the latter configured to couple the die 404-3 to further components). Although not specifically shown in FIG. 4, in some embodiments, the die 404-3 may be electrically and mechanically coupled to the circuit board 402 by DTCB interconnects similar to how the die 404-1 is coupled to the circuit board 402 by the DTCB interconnects 410.

The DTD interconnects 430, or any other DTD interconnects described herein, may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects in a microelectronic assembly or an IC package as described herein may be solder interconnects that include a solder with a higher melting point than a solder included in some or all of the DTCB interconnects. For example, when the DTD interconnects in an IC package are formed before the DTCB interconnects are formed, solder-based DTD interconnects may use a higher-temperature solder, while the DTCB interconnects may use a lower-temperature solder.

In some embodiments, a set of DTD interconnects may include solder. DTD interconnects that include solder may include any appropriate solder material, such as any of the materials discussed above for the DTCB interconnects. In some embodiments, a set of DTD interconnects may include an anisotropic conductive material, such as any of the materials discussed above for the DTCB interconnects.

In some embodiments, the IC package 400 may include at least two dies 404 that are hybrid bonded. This is illustrated in FIG. 4 with the die 404-1 being hybrid bonded to the die 404-2 with a bonding material/interface 440 therebetween. In other embodiments, no bonding material may be used, but there will still be a bonding interface resulting from the bonding of the first and second IC structures (e.g., bonding of the faces of the dies 404-1 and 404-2, shown in FIG. 4) to one another. Thus, in such embodiments, 440 shown in FIG. 4 refers to a bonding interface.

As used herein, the terms "hybrid bonding" or "hybrid manufacturing" refer to fabricating a microelectronic assembly by bonding together at least two IC dies (e.g., the dies 404-1 and 404-2, shown in FIG. 4) fabricated by different manufacturers, using different materials, or different manufacturing techniques. When the front side of the first IC die is bonded to the front side of the second IC die, the dies are described as bonded "face-to-face" (f2f). When the front side of the first IC die is bonded to the back side of the second IC die or the back side of the first IC die is bonded to the front side of the second IC die, the structures are described as bonded "face-to-back" (f2b). When the back side of the first IC die is bonded to the back side of the second IC die, the dies are described as bonded "back-to-back" (b2b).

In some embodiments, hybrid bonding of the faces of the first and second IC dies may be performing using insulator-insulator bonding, e.g., as oxide-oxide bonding, where an insulating material of the first IC die is bonded to an insulating material of the second IC die. In some embodiments, a bonding material may be present in between the faces of the first and second IC dies that are bonded together. Such a material is shown in FIG. 4 but is shown as the bonding material 440. To that end, the bonding material 440 may be applied to the one or both faces of the first and second IC dies that should be bonded and then the first and second IC dies are put together, possibly while applying a suitable pressure and heating up the assembly to a suitable temperature (e.g., to moderately high temperatures, e.g., between about 50 and 200 degrees Celsius) for a duration of time. In some embodiments, the bonding material may be an adhesive material that ensures attachment of the first and second IC dies to one another. In some embodiments, the bonding material 440 may be an etch-stop material. In some embodiments, the bonding material 440 may be both an etch-stop material and have suitable adhesive properties to ensure attachment of the first and second IC dies to one another. In some embodiments, the bonding material 440 may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, could be a characteristic feature of the hybrid bonding. Using an etch-stop material at the interface (i.e., the interface between the first and second IC dies 404-1 and 404-2) that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the first and second IC dies together. In addition, an etch-stop material at the interface between the first and second IC dies that includes include silicon, nitrogen, and carbon, where the atomic percentage of any of these materials may be at least 1%, may be advantageous in terms of improving etch-selectivity of this material with respect to etch-stop materials that may be used in different of the first and second IC dies.

In some embodiments, no bonding material may be used, but there will still be a bonding interface resulting from the bonding of the first and second IC dies to one another. Such a bonding interface may be recognizable as a seam or a thin layer in the microelectronic assembly, using, e.g., selective area diffraction (SED), even when the specific materials of the insulators of the first and second IC dies that are bonded together may be the same, in which case the bonding interface would still be noticeable as a seam or a thin layer in what otherwise appears as a bulk insulator (e.g., bulk oxide) layer.

Although not specifically shown in FIG. 4, in some embodiments, one or more of the signal vias or the power vias may be provided after the dies 404-1 and 404-2 have been hybrid bonded. In such embodiments, the one or more of the signal vias or the power vias provided after the hybrid bonding may extend from one face of one of the dies 404-1 and 404-2 (e.g., from the top of the die 404-2, shown at the top of the die 404-1 in FIG. 4), towards, the other face of that die (e.g., towards the bottom face of the die 404-2), and may extend through the bonding interface 440 and into the die 404-1, so that power and signals may be communicated between various IC components (e.g., transistors) of the dies 404-1 and 404-2.

FIG. 4 further illustrates that, in some embodiments, the IC package 400 may include one or more of a mold material 450, a thermal interface material (TIM) 452, and a heat spreader 454 (i.e., in other embodiments of the IC package 400, one or more of the mold material 450, the TIM 452, and the heat spreader 454 may be absent).

The mold material 450 may extend around one or more of the dies 404 over the circuit board 402. In some embodiments, the mold material 450 may extend above one or more of the dies 404 on the circuit board 402. In some embodiments, the mold material 450 may extend between one or more of the dies 404 and the circuit board 402 around the associated DTCB interconnects 410. In such embodiments, the mold material 450 may serve as an underfill material. In some embodiments, the mold material 450 may extend between different ones of the dies 404 around the associated DTD interconnects 430. In such embodiments, the mold material 450 may serve as an underfill material. The mold material 450 may include multiple different mold materials (e.g., an underfill material, and a different overmold material). The mold material 450 may be an insulating material, such as an appropriate epoxy material. In some embodiments, the mold material 450 may include an underfill material that is an epoxy flux that assists with soldering the die 404-1 to the circuit board 402 when forming the DTCB interconnects 410, and then polymerizes and encapsulates the DTCB interconnects 410. The mold material 450 may be selected to have a coefficient of thermal expansion (CTE) that may mitigate or minimize the stress between the dies 404 and the circuit board 402 arising from uneven thermal expansion in the IC package 400. In some embodiments, the CTE of the mold material 450 may have a value that is intermediate to the CTE of the circuit board 402 (e.g., the CTE of the dielectric material of the circuit board 402) and a CTE of the dies 404.

The TIM 452 may include a thermally conductive material (e.g., metal particles) in a polymer or other binder. The TIM 452 may be a thermal interface material paste or a thermally conductive epoxy (which may be a fluid when applied and may harden upon curing, as known in the art). The TIM 452 may provide a path for heat generated by the dies 404 to readily flow to the heat spreader 454, where it may be spread and/or dissipated. Some embodiments of the IC package 400 of FIG. 4 may include a sputtered back side metallization (not shown) across the mold material 450 and the dies 404. In such embodiments, the TIM 452 (e.g., a solder TIM) may be disposed on this back side metallization.

The heat spreader 454 may be used to move heat away from the dies 404 (e.g., so that the heat may be more readily dissipated by a heat sink or other thermal management device). The heat spreader 454 may include any suitable thermally conductive material (e.g., metal, appropriate ceramics, etc.), and may include any suitable features (e.g., fins). In some embodiments, the heat spreader 454 may be an integrated heat spreader.

In some embodiments of FIG. 4, the die 404-1 may provide high density interconnect routing in a localized area of the IC package 400. In some embodiments, the presence of the die 404-1 may support direct chip attach of fine-pitch semiconductor dies (e.g., the dies 404-2 and 404-3) that cannot be attached entirely directly to the circuit board 402. In particular, as discussed above, the die 404-1 may support trace widths and spacings that are not achievable in the circuit board 402. The proliferation of wearable and mobile electronics, as well as Internet of Things (IoT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the IC packages 400 disclosed herein may be capable of supporting chips with high density interconnects and chips with low-density interconnects without sacrificing performance or manufacturability.

In various embodiments of FIG. 4, any of the dies 404 may be a single-sided, single-pitch die; in other embodiments, any of the dies 404 may be a double-sided die, and additional components may be disposed on the top surface of any of the dies 404. Additional passive components, such as surface-mount resistors, capacitors, and/or inductors, may be disposed on the top surface or the bottom surface of the circuit board 402, or embedded in the circuit board 402. More generally, any suitable number of the dies 404 in an IC package 400 may be double-sided dies 404.

Example Devices

Figure 7:
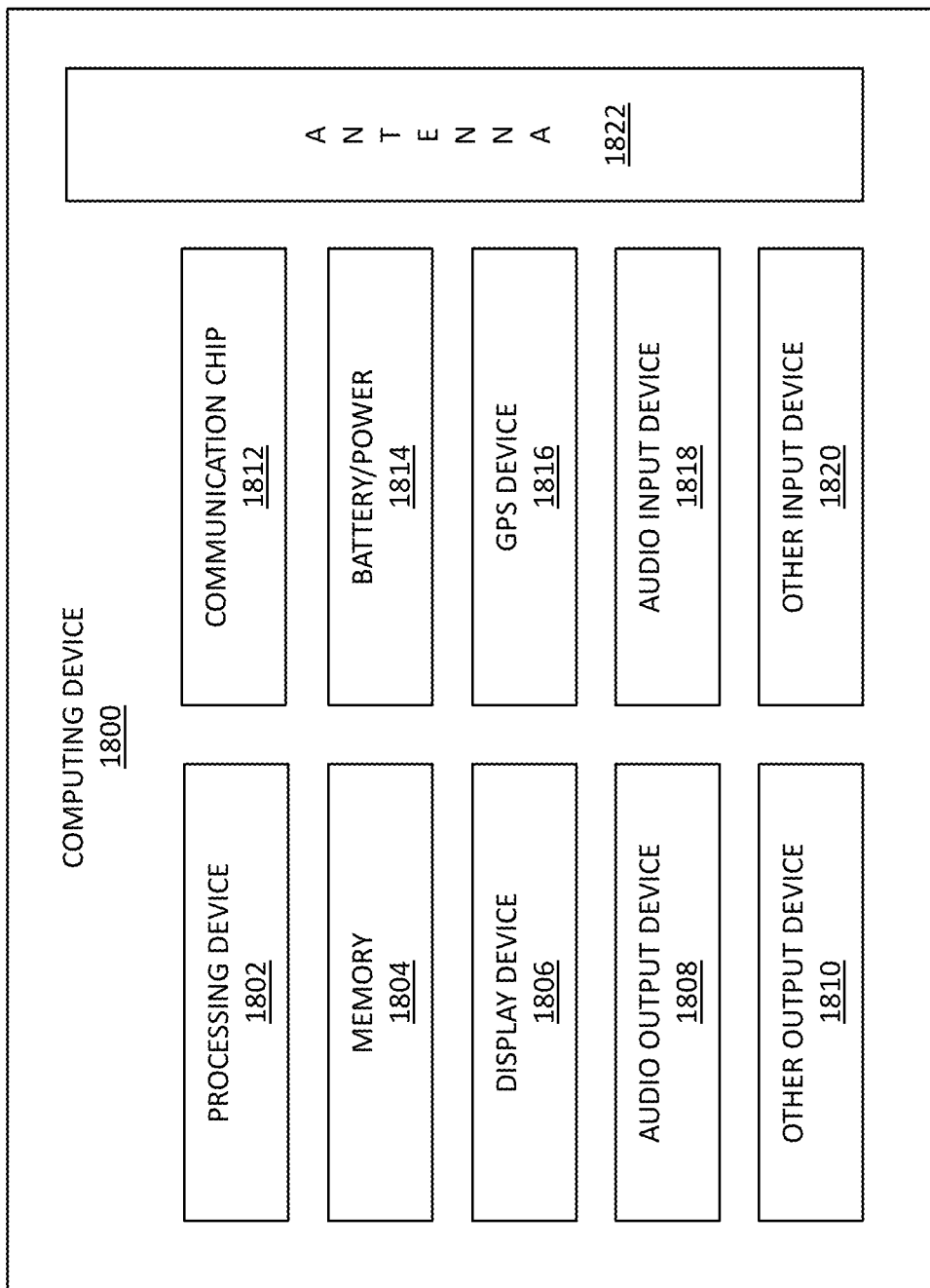
FIG. 7 is a block diagram of an example computing device 1800 that may include one or more dies configured for direct chip attach to circuit boards and/or microelectronic assemblies with one or more dies configured for direct chip attach to circuit boards, in accordance with some embodiments.

The dies and microelectronic assemblies disclosed herein, as well as IC packages and IC assemblies that include such dies and microelectronic assemblies, may be included in any suitable electronic device. FIGS. 5-7 illustrate various examples of apparatuses that may include one or more of the dies configured for direct chip attach to circuit boards, or microelectronic assemblies, and IC packages with such dies, as disclosed herein.

Figures 5A, 5B:
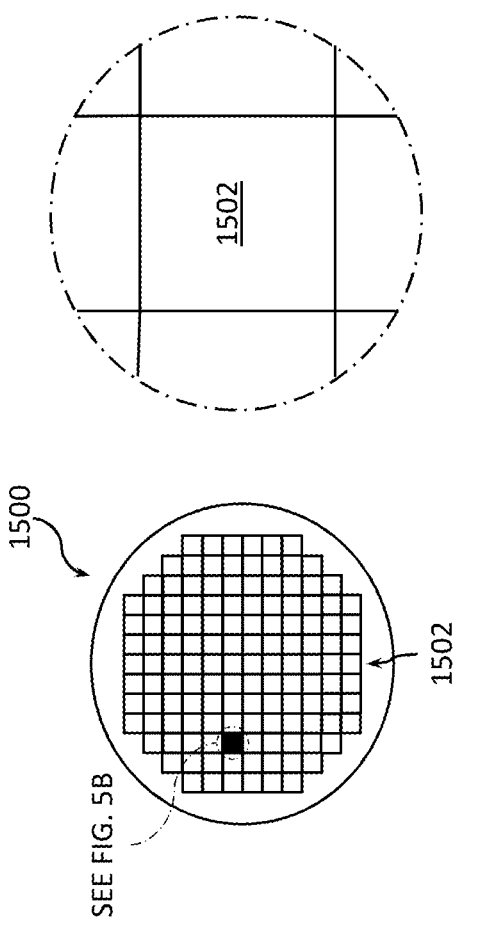
FIGS. 5A and 5B are top views of, respectively, a wafer and dies that may be used to implement one or more dies configured for direct chip attach to circuit boards, in accordance with some embodiments.

FIGS. 5A and 5B are top views of, respectively, a wafer 1500 and dies 1502 that may be used to implement one or more dies configured for direct chip attach to circuit boards in accordance with any of the embodiments disclosed herein. In some embodiments, the dies 1502 may be included in an IC package (e.g., the IC package 400 as shown in FIG. 4) and/or in an IC device (e.g., any of the microelectronic assemblies 100, 200, 300 as shown in FIGS. 1-3), in accordance with any of the embodiments disclosed herein. For example, any of the dies 1502 may serve as the base die 110 shown in FIGS. 1-3 and/or any of the dies 1502 may serve as the IC device 1600 shown in FIG. 6. The wafer 1500 may be composed of semiconductor material and may include one or more dies 1502 having IC structures formed on a surface of the wafer 1500. Each of the dies 1502 may be a repeating unit of a semiconductor product that includes any suitable IC as described herein. After the fabrication of the semiconductor product is complete (e.g., after manufacture of one or more of the ICs to be included in microelectronic assemblies as described herein), the wafer 1500 may undergo a singulation process in which each of the dies 1502 is separated from one another to provide discrete "chips" of the semiconductor product. In particular, devices that include one or more IC structures to be included in microelectronic assemblies as described herein may take the form of the wafer 1500 (e.g., not singulated) or the form of the die 1502 (e.g., singulated). The die 1502 may include one or more transistors (e.g., one or more of the transistors as described with reference to the microelectronic assemblies 100, 200, 300 and/or one or more of the transistors 1640 of FIG. 6, discussed below), supporting circuitry to route electrical signals to the transistors, passive components (e.g., signal traces, resistors, capacitors, or inductors), and/or any other IC components. The die 1502 may include supporting circuitry to route electrical signals to various memory cells, transistors, capacitors, as well as any other IC components. In some embodiments, the wafer 1500 or the die 1502 may implement or include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 7) or other logic that is configured to store information in the memory devices or execute instructions stored in the memory array.

FIG. 6 is a cross-sectional side view of an IC device 1600 that may be included in any of the dies and/or microelectronic assemblies disclosed herein. One or more of the IC devices 1600 may be included in one or more dies 1502 of FIG. 5. One or more of the IC devices 1600 may be included in one or more of the dies, microelectronic assemblies, and IC packages as described herein, e.g., as described with reference to FIGS. 1-4. For example, the IC device 1600 may be used to implement the base die 110, or any of the dies 404, as described herein.

As shown in FIG. 6, the IC device 1600 may be formed on a substrate 1602 (e.g., the wafer 1500 of FIG. 5) and may be included in a die (e.g., the die 1502 of FIG. 5). The substrate 1602 may be a semiconductor substrate composed of semiconductor material systems including, for example, N-type or P-type materials systems (or a combination of both). The substrate 1602 may include, for example, a crystalline substrate formed using a bulk SOI substructure. In some embodiments, the substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 5) or a wafer (e.g., the wafer 1500 of FIG. 5).

The IC device 1600 may include one or more device layers 1604 disposed on the substrate 1602. The device layer 1604 may include features of one or more transistors 1640 (e.g., metal oxide semiconductor FETs (MOSFETs)) formed on the substrate 1602. The device layer 1604 may include, for example, one or more S/D regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate electrode may include at least one P-type work function metal or N-type work function metal, depending on whether the transistor 1640 is a P-type MOS (PMOS) transistor or an N-type MOS (NMOS) transistor. For a PMOS transistor 1640, metals that may be used for the gate electrode may include, but are not limited to, ruthenium, palladium, platinum, cobalt, nickel, and conductive metal oxides (e.g., ruthenium oxide). For an NMOS transistor 1640, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode may include a stack of two or more metal layers, where one or more metal layers are workfunction metal layers and at least one metal layer is a fill metal layer. Further metal layers may be included for other purposes, such as to act as a diffusion barrier layer, described below.

If used, the gate dielectric of the transistor 1640 may at least laterally surround the channel portion of the channel material, and the gate electrode may laterally surround the gate dielectric such that the gate dielectric is disposed between the gate electrode and the channel material of transistor 1640. In various embodiments, the gate dielectric may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric during manufacture of the transistor 1640 to improve the quality of the gate dielectric. In some embodiments, the gate dielectric may have a thickness between about 0.5 nanometers and 3 nanometers, including all values and ranges therein, e.g., between about 1 and 3 nanometers, or between about 1 and 2 nanometers.

In some embodiments, the gate dielectric may be a multilayer gate dielectric, e.g., it may include any of the high-k dielectric materials in one layer and a layer of IGZO. In some embodiments, the gate stack may be arranged so that the IGZO is disposed between the high-k dielectric and the channel material of the transistor 1640. In such embodiments, the IGZO may be in contact with the channel material and may provide the interface between the channel material and the remainder of the multilayer gate dielectric. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, when viewed as a cross-section of the transistor 1640 along the source-channel-drain direction, the gate electrode may consist of a U-shaped structure that includes a bottom portion substantially parallel to the surface of the substrate 1602 and two sidewall portions that are substantially perpendicular to the top surface of the substrate 1602. In other embodiments, at least one of the metal layers that form the gate electrode may simply be a planar layer that is substantially parallel to the top surface of the substrate 1602 and does not include sidewall portions substantially perpendicular to the top surface of the substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process. In the former process, dopants such as boron, aluminum, antimony, phosphorous, or arsenic may be ion-implanted into the one or more semiconductor materials of the upper portion of the channel material of the transistor 1640 to form the S/D regions 1620. An annealing process that activates the dopants and causes them to diffuse further into the channel material of the transistor 1640 may follow the ion implantation process. In the latter process, the one or more semiconductor materials of the channel material of the transistor 1640 may first be etched to form recesses at the locations for the future S/D regions 1620. An epitaxial deposition process may then be carried out to fill the recesses with material (which may include a combination of different materials) that is used to fabricate the S/D regions 1620. In some implementations, the S/D regions 1620 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 1620 may be formed using one or more alternate semiconductor materials such as germanium or a group III-V material or alloy.

Electrical signals, such as power and/or I/O signals, may be routed to and/or from the devices (e.g., transistors 1640) of the device layer 1604 through one or more interconnect layers disposed on the device layer 1604 (illustrated in FIG. 6 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. For example, the one or more interconnect layers 1606-1610 may form the front side metallization stack 120 as described herein. Similar one or more interconnect layers 1606-1610 but provided on the other side of the substrate 1602 may form the back side metallization stack 130 as described herein.

The interconnect structures 1628 may be arranged within the interconnect layers 1606-1610 to route electrical power/signals according to a wide variety of designs; in particular, the arrangement is not limited to the particular configuration of interconnect structures 1628 depicted in FIG. 6. Although a particular number of interconnect layers 1606-1610 is depicted in FIG. 6, embodiments of the present disclosure include IC devices having more or fewer interconnect layers than depicted.

In some embodiments, the interconnect structures 1628 may include lines (or traces) 1628*a* and/or vias 1628*b* filled with an electrically conductive material such as a metal. The lines 1628*a* may be arranged to route electrical power/signals in a direction of a plane that is substantially parallel with a surface of the substrate 1602 upon which the device layer 1604 is formed. For example, the lines 1628*a* may route electrical power/signals in a direction in and out of the page from the perspective of FIG. 6. The vias 1628*b* may be arranged to route electrical power/signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 6. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 6, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical power/signals from the interconnect layers 1606-1610; for example, the conductive contacts 1636 may include other analogous features (e.g., posts) that route the electrical signals to external components. The conductive contacts 1636 may serve as the conductive contacts described above, as appropriate.

In some embodiments in which the IC device 1600 is a double-sided die (e.g., similar to the example of the die 404-1, shown in FIG. 4), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636. These additional conductive contacts may serve as the conductive contacts described above, as appropriate.

In other embodiments in which the IC device 1600 is a double-sided die (e.g., similar to the example of the die 404-1, shown in FIG. 4), the IC device 1600 may include one or more TSVs through the substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636. These additional conductive contacts may serve as the conductive contacts described above, as appropriate.

FIG. 7 is a block diagram of an example computing device 1800 that may include one or more components with one or more dies and/or microelectronic assemblies in accordance with any of the embodiments disclosed herein. For example, any suitable ones of the components of the computing device 1800 may include an IC package (e.g., the IC package 400 as shown in FIG. 4) and/or in an IC device (e.g., any of the microelectronic assemblies 100, 200, 300 as shown in FIGS. 1-3). Any of the components of the computing device 1800 may include an IC device 1600 (e.g., as shown in FIG. 6).

A number of components are illustrated in FIG. 7 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single System-on-a-Chip (SoC) die.

Additionally, in various embodiments, the computing device 1800 may not include one or more of the components illustrated in FIG. 7, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1818 or an audio output device 1808 but may include audio input or output device interface circuitry (e.g., connectors and supporting circuitry) to which an audio input device 1818 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802.

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1818 (or corresponding interface circuitry, as discussed above). The audio input device 1818 may include any device that generates a signal representative of a sound, such as microphones, microphone arrays, or digital instruments (e.g., instruments having a musical instrument digital interface (MIDI) output).

The computing device 1800 may include a GPS device 1816 (or corresponding interface circuitry, as discussed above). The GPS device 1816 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

Select Examples

The following paragraphs provide various examples of the embodiments disclosed herein.

Example 1 provides a microelectronic assembly that includes a base die (e.g., a base die 110), having a front side and a back side, the back side being opposite the front side, the base die including IC components, provided over the front side of the base die, and further including base die interconnects; a back side metallization stack, provided over the back side of the base die, the back side metallization stack including signal lines; and back side conductive contacts, provided over the back side metallization stack, configured to route signals to and from the IC components via the back side metallization stack and the base die interconnects.

Example 2 provides the microelectronic assembly according to example 1, where the back side conductive contacts are configured to be coupled to a circuit board (e.g., a motherboard, e.g., a PCB) and configured to route signals between the circuit board and the IC components of the base die.

Example 3 provides the microelectronic assembly according to example 2, where the back side conductive contacts are configured to be coupled to the circuit board in absence of a package substrate between the back side metallization stack and the circuit board.

Example 4 provides the microelectronic assembly according to any one of the preceding examples, where individual ones of the back side conductive contacts are electrically coupled to one or more of the signal lines, the one or more of the signal lines are electrically coupled to one or more of the base die interconnects, and the one or more of the base die interconnects are electrically coupled to one or more of the IC components.

Example 5 provides the microelectronic assembly according to any one of the preceding examples, where a pitch of the signal lines in the back side metallization stack is smaller than a pitch of the back side conductive contacts, e.g., at least 10 times smaller or at least 100 times smaller. For example, the pitch of the signal lines may be between about 100 nm and 250 nm, including all values and ranges therein, while the pitch of the back side conductive contacts provided over the back side metallization stack may be between about 150 and 250 micron, including all values and ranges therein.

Example 6 provides the microelectronic assembly according to any one of the preceding examples, where widths of the signal lines in the back side metallization stack are smaller than widths of the back side conductive contacts, e.g., at least 10 times smaller or at least 100 times smaller. In some embodiments, the widths of the signal lines and of the back side conductive contacts may be between about 35% and 65%, e.g., between about 45% and 55%, of their respective pitches.

Example 7 provides the microelectronic assembly according to any one of the preceding examples, further including a redistribution layer (RDL), provided over the back side metallization stack between the back side metallization stack and the back side conductive contacts, the RDL including RDL interconnects, configured to electrically couple individual ones of the back side conductive contacts to one or more of the signal lines in the back side metallization stack.

Example 8 provides the microelectronic assembly according to example 7, where the RDL has a first face and a second face, the second face being opposite the first face; the RDL interconnects includes first RDL interconnects at the first face of the RDL and second RDL interconnects at the second face of the RDL; the first RDL interconnects are coupled to individual ones of the signal lines of the back side metallization stack; and the second RDL interconnects are coupled to individual ones of the back side conductive contacts (i.e., the first face of the RDL is facing the back side metallization stack and is closer to the back side metallization stack than the second side of the RDL).

Example 9 provides the microelectronic assembly according to examples 7 or 8, where individual ones of the back side conductive contacts are in conductive contact with one or more of the RDL interconnects.

Example 10 provides the microelectronic assembly according to any one of the preceding examples, where the back side metallization stack further includes a backend transistors, configured to electrically couple individual ones of the back side conductive contacts to one or more of the signal lines in the back side metallization stack.

Example 11 provides the microelectronic assembly according to example 10, where the backend transistors includes TFTs.

Example 12 provides the microelectronic assembly according to examples 10 or 11, where individual ones of the back side conductive contacts are in conductive contact with one or more of the backend transistors or one or more of the signal lines. In such embodiments, there is no RDL between the back side metallization stack and the back side conductive contacts.

Example 13 provides the microelectronic assembly according to any one of the preceding examples, where the base die interconnects include signal vias extending between the front side and the back side of the base die (i.e., these signal vias are TSVs).

Example 14 provides the microelectronic assembly according to example 13, where a pitch of the signal vias is between about 2 and 12 micron, e.g., between about 4 and 9 micron.

Example 15 provides the microelectronic assembly according to examples 13 or 14, where cross-sectional dimensions (e.g., diameters or widths) of the signal vias are between about 2 and 4 micron, e.g., about 3 micron. In some embodiments, the cross-sectional dimensions of the signal vias may be between about 35% and 65%, e.g., between about 45% and 55%, of the pitch of these vias.

Example 16 provides the microelectronic assembly according to any one of the preceding examples, further including a front side metallization stack, provided over the front side of the base die, the front side metallization stack including power interconnects (e.g., conductive vias and lines), configured to provide power to the IC components.

Example 17 provides the microelectronic assembly according to example 16, where a pitch of the power interconnects is between about 10 and 25 micron, e.g., between about 15 and 20 micron.

Example 18 provides the microelectronic assembly according to examples 16 or 17, where cross-sectional dimensions (e.g., diameters or widths) of the power interconnects are between about 7 and 11 micron, e.g., about 9 micron. In some embodiments, the cross-sectional dimensions of the power interconnects may be between about 35% and 65%, e.g., between about 45% and 55%, of the pitch of these interconnects.

Example 19 provides the microelectronic assembly according to any one of the preceding examples, further including solder (e.g., solder bumps or balls that are subject to a thermal reflow to form the DTCB interconnects) in conductive contact with respective ones of the back side conductive contacts.

Example 20 provides the microelectronic assembly according to any one of the preceding examples, further including a circuit board; circuit board conductive contacts (162), provided over a first face of the circuit board; and DTCB interconnects (e.g., solder bumps 154) between the circuit board conductive contacts and the back side conductive contacts.

Example 21 provides the microelectronic assembly according to example 20, where the DTCB interconnects include solder.

Example 22 provides the microelectronic assembly according to examples 20 or 21, where a pitch of the signal lines is smaller than a pitch of the DTCB interconnects.

Example 23 provides the microelectronic assembly according to any one of examples 20-22, where the circuit board includes a first layer and a second layer, the second layer is between the first layer and the back side metallization stack, the first layer includes one or more conductive lines, and the second layer includes an insulator material and circuit board conductive vias extending, through the insulator material, between respective circuit board conductive contacts and individual ones of the conductive lines.

Example 24 provides the microelectronic assembly according to example 23, where an individual one of the circuit board conductive contacts overlaps and is in conductive contact with a respective one of the circuit board conductive vias (thus, individual ones of the circuit board conductive vias is under respective ones of the circuit board conductive contacts).

Example 25 provides the microelectronic assembly according to examples 23 or 24, where the one or more conductive lines are buried conductive lines (e.g., because they are not at the face of the circuit board over which circuit board conductive contacts are provided, but, rather, are buried under the insulator material of the second layer of the circuit board).

Example 26 provides the microelectronic assembly according to any one of any one of examples 20-25, where the circuit board is a motherboard.

Example 27 provides the microelectronic assembly according to any one of any one of examples 20-26, where the circuit board is a PCB.

Example 28 provides the microelectronic assembly according to any one of the preceding examples, further including an additional die, coupled to the front side of the base die.

Example 29 provides the microelectronic assembly according to example 28, where the additional die is coupled to the front side of the base die by hybrid bonding.

Example 30 provides the microelectronic assembly according to example 28, where the additional die is coupled to the front side of the base die by DTD interconnects.

Example 31 provides a microelectronic assembly that includes a circuit board, having a front side and a back side, the back side being opposite the front side; and circuit board conductive contacts, provided over the front side of the circuit board, where the circuit board includes a first layer and a second layer, the second layer is between the front side of the circuit board and the first layer, the first layer includes a conductive line, and the second layer includes an insulator material and a conductive via extending through the insulator material, the conductive via having a first end in conductive contact with the conductive line and having a second end in conductive contact with one of the circuit board conductive contacts.

Example 32 provides the microelectronic assembly according to example 31, where the one of the circuit board conductive contacts overlaps the second end of the conductive via.

Example 33 provides the microelectronic assembly according to examples 31 or 32, where the conductive line or one of one or more conductive lines of the first layer, the conductive via is one of a plurality of conductive vias extending through the insulator material of the second layer, a pitch of the plurality of conductive vias is between about 150 and 250 micron, e.g., between about 190 and 230 micron, e.g., about 210 micron.

Example 34 provides the microelectronic assembly according to any one of examples 31-33, where the insulator material include an epoxy material.

Example 35 provides the microelectronic assembly according to any one of examples 31-34, further including a base die (e.g., a base die 110), having a first side and a second side, the second side being opposite the first side, the base die including IC components; a metallization stack, provided over the first side of the base die, the metallization stack including signal lines; base die conductive contacts, provided over the metallization stack; and DTCB interconnects (e.g., solder bumps 154) between the circuit board conductive contacts and the base die conductive contacts, the DTCB interconnects configured to route signals between the IC components and the circuit board via the metallization stack.

Example 36 provides the microelectronic assembly according to example 35, where the IC components are provided over the first side of the base die (e.g., the first side of the base die is a front side and the second side is a back side), and the base die is coupled to the circuit board by the DTCB interconnects in a flip-chip configuration (i.e., the front side of the base die is facing the circuit board and is closer to the circuit board than the back side of the base die).

Example 37 provides the microelectronic assembly according to example 35, where the IC components are provided over the second side of the base die (e.g., the second side of the base die is a front side and the first side is a back side), the metallization stack is a back side metallization stack of the base die, and the base die further includes base die interconnects configured to electrically couple the IC components, provided over one side of the base die, to one or more of the signal lines of the metallization stack provided over the other side of the base die.

Example 38 provides the microelectronic assembly according to any one of examples 35-37, where the DTCB interconnects include solder.

Example 39 provides the microelectronic assembly according to any one of examples 31-38, further including a base die (e.g., a base die 110), having a front side and a back side, the back side being opposite the front side, the base die including IC components, provided over the front side of the base die, and further including base die interconnects; a back side metallization stack, provided over the back side of the base die, the back side metallization stack including signal lines; back side conductive contacts, provided over the back side metallization stack; and DTCB interconnects (e.g., solder bumps 154) between the circuit board conductive contacts and the back side conductive contacts, the DTCB interconnects configured to route signals between the IC components and the circuit board via the back side metallization stack and the base die interconnects.

Example 40 provides the microelectronic assembly according to example 39, where the microelectronic assembly is the microelectronic assembly according to any one of examples 1-30.

Example 41 provides a circuit board package that includes a microelectronic assembly according to any one of the preceding examples; and a mold material, at least partially enclosing the microelectronic assembly.

Example 42 provides the circuit board package according to example 41, further including a heat spreader, configured to dissipate heat from the microelectronic assembly.

Example 43 provides an electronic device that includes a microelectronic assembly according to any one of the preceding examples or a circuit board package according to any one of the preceding examples.

Example 44 provides the electronic device according to example 43, where the electronic device is a server processor.

Example 45 provides the electronic device according to example 43, where the electronic device is a computing device.

Example 46 provides the electronic device according to example 43, where the electronic device is a wearable electronic device (e.g., a smart watch) or a handheld electronic device (e.g., a mobile phone).

Example 47 provides the electronic device according to any one of examples 43-46, where the electronic device further includes one or more communication chips and an antenna.

Example 48 provides a method of manufacturing a microelectronic assembly, the method including providing the microelectronic assembly according to any one of the preceding examples.

Example 49 provides a method of manufacturing a circuit board package, the method including providing the circuit board package according to any one of the preceding examples.

Example 50 provides a method of manufacturing an electronic device, the method including providing the electronic device according to any one of the preceding examples.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A microelectronic assembly, comprising:
 a base die having a front side and a back side, the back side being opposite the front side, the base die including transistors over the front side of the base die, and further including base die interconnects, wherein the base die interconnects include conductive vias extending between the front side and the back side of the base die;
 a back side metallization stack over the back side of the base die, the back side metallization stack including conductive lines;
 back side conductive contacts over the back side metallization stack, the back side conductive contacts coupled to the transistors via the back side metallization stack and the base die interconnects;
 a front side metallization stack over the front side of the base die, the front side metallization stack including conductive interconnects coupled to the transistors,
 wherein a pitch of the conductive interconnects is between about 10 microns and 25 microns, cross-sectional dimensions of the conductive interconnects are between about 7 microns and 11 microns, a pitch of the conductive vias is between about 2 microns and 12 microns, and cross-sectional dimensions of the conductive vias are between about 2 microns and 4 microns.

2. The microelectronic assembly according to claim 1, wherein the back side conductive contacts are to be coupled to a circuit board in absence of a package substrate between the back side metallization stack and the circuit board.

3. The microelectronic assembly according to claim 1, wherein:
individual ones of the back side conductive contacts are electrically coupled to one or more of the conductive lines,
individual ones of the one or more of the conductive lines are electrically coupled to one or more of the base die interconnects, and
individual ones of the one or more of the base die interconnects are electrically coupled to one or more of the transistors.

4. The microelectronic assembly according to claim 1, wherein:
a pitch of the conductive lines is smaller than a pitch of the back side conductive contacts, and
widths of the conductive lines are smaller than widths of the back side conductive contacts.

5. The microelectronic assembly according to claim 1, further comprising a redistribution layer (RDL) between the back side metallization stack and the back side conductive contacts, the RDL including RDL interconnects, wherein the RDL interconnects electrically couple individual ones of the back side conductive contacts and one or more of the conductive lines in the back side metallization stack.

6. The microelectronic assembly according to claim 5, wherein:
the RDL has a first face and a second face, the second face being opposite the first face,
the RDL interconnects includes first RDL interconnects at the first face of the RDL and second RDL interconnects at the second face of the RDL,
the first RDL interconnects are coupled to individual ones of the conductive lines, and
the second RDL interconnects are coupled to individual ones of the back side conductive contacts.

7. The microelectronic assembly according to claim 1, wherein the back side metallization stack further includes a backend transistors, wherein the backend transistors electrically couple individual ones of the back side conductive contacts and one or more of the conductive lines in the back side metallization stack, and wherein the backend transistors includes thin-film transistors.

8. The microelectronic assembly according to claim 1, further comprising:
a circuit board;
circuit board conductive contacts over a first face of the circuit board; and
die-to-circuit board (DTCB) interconnects between the circuit board conductive contacts and the back side conductive contacts.

9. The microelectronic assembly according to claim 8, wherein:
the circuit board includes a first layer and a second layer,
the second layer is between the first layer and the back side metallization stack,
the first layer includes one or more conductive lines, and
the second layer includes an insulator material and circuit board conductive vias extending, through the insulator material, between respective circuit board conductive contacts and individual ones of the conductive lines.

10. The microelectronic assembly according to claim 9, wherein an individual one of the circuit board conductive contacts overlaps and is in conductive contact with a respective one of the circuit board conductive vias.

11. The microelectronic assembly according to claim 9, wherein the one or more conductive lines are buried conductive lines.

12. The microelectronic assembly according to claim 8, wherein a pitch of the conductive lines is smaller than a pitch of the DTCB interconnects.

13. The microelectronic assembly according to claim 1, wherein:
the conductive interconnects are to provide power to the transistors.

14. The microelectronic assembly according to claim 13, wherein:
the conductive vias are signal vias.

15. The microelectronic assembly according to claim 1, further comprising:
an additional die coupled to the front side of the base die; and
a hybrid bonding interface between the additional die and the front side of the base die.

16. A microelectronic assembly, comprising:
a circuit board having a front side and a back side, the back side being opposite the front side;
first conductive contacts over the front side of the circuit board;
a base die having a first side and a second side, the second side being opposite the first side, the base die including integrated circuit (IC) components;
a metallization stack over the first side of the base die, the metallization stack including conductive lines;
second conductive contacts over the metallization stack; and
interconnects between the first conductive contacts and the second conductive contacts,
wherein:
the base die is coupled to the circuit board in a flip-chip configuration,
the circuit board includes a first layer and a second layer,
the second layer is between the front side of the circuit board and the first layer,
the first layer includes a conductive line, and
the second layer includes an insulator material and a conductive via extending through the insulator material, the conductive via having a first end in conductive contact with the conductive line and having a second end in conductive contact with one of the first conductive contacts.

17. The microelectronic assembly according to claim 16, wherein the one of the first conductive contacts overlaps the second end of the conductive via.

18. The microelectronic assembly according to claim 16, wherein:
the conductive line or one of one or more conductive lines of the first layer,
the conductive via is one of a plurality of conductive vias extending through the insulator material of the second layer, and
a pitch of the conductive vias is between about 150 and 250 micrometers.

19. The microelectronic assembly according to claim 16, wherein:
the IC components are over the first side of the base die.

20. The microelectronic assembly according to claim 16, wherein:

the IC components are over the second side of the base die, and the base die further includes base die interconnects, wherein the base die interconnects electrically couple the IC components and one or more of the conductive lines.

* * * * *